US012341123B2

(12) United States Patent
Yang

(10) Patent No.: US 12,341,123 B2
(45) Date of Patent: Jun. 24, 2025

(54) SEMICONDUCTOR DEVICE HAVING A BONDING WIRE IN A HOLE IN THE SUBSTRATE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 542 days.

(21) Appl. No.: 17/742,549

(22) Filed: May 12, 2022

(65) Prior Publication Data
US 2023/0369280 A1 Nov. 16, 2023

(51) Int. Cl.
*H01L 23/00* (2006.01)
*H01L 25/065* (2023.01)

(52) U.S. Cl.
CPC ............. *H01L 24/48* (2013.01); *H01L 24/16* (2013.01); *H01L 24/73* (2013.01); *H01L 25/0657* (2013.01); *H01L 2224/16225* (2013.01); *H01L 2224/32225* (2013.01); *H01L 2224/4824* (2013.01); *H01L 2225/0651* (2013.01); *H01L 2225/06517* (2013.01); *H01L 2225/06562* (2013.01); *H01L 2924/15151* (2013.01)

(58) Field of Classification Search
CPC ....... H01L 25/0657; H01L 2224/16225; H01L 2224/4824; H01L 2225/06517; H01L 2224/0651; H01L 2924/15151
See application file for complete search history.

(56) References Cited

U.S. PATENT DOCUMENTS

| 2003/0057539 A1* | 3/2003 | Koopmans | ............. H01L 24/05 257/E23.021 |
| 2006/0290005 A1 | 12/2006 | Thomas et al. | |
| 2007/0170575 A1* | 7/2007 | Lee | ..................... H01L 25/0657 257/E25.013 |

(Continued)

FOREIGN PATENT DOCUMENTS

| TW | 200830520 A | 7/2008 |
| TW | 200849500 A | 12/2008 |

(Continued)

OTHER PUBLICATIONS

Office Action and and the search report mailed on Dec. 6, 2024 related to U.S. Appl. No. 17/743,044.

*Primary Examiner* — Kevin Parendo
(74) *Attorney, Agent, or Firm* — Xuan Zhang

(57) ABSTRACT

A semiconductor device and method for manufacturing the same are provided. The semiconductor device includes a substrate, a first electronic component, a second electronic component, a bonding wire, and an encapsulant. The substrate has a lower surface and an upper surface opposite to the lower surface. The first electronic component is disposed on the upper surface of the substrate. The bonding wire electrically connects the first electronic component and the substrate and extends within the substrate. The second electronic component is disposed on the upper surface of the substrate. The second electronic component has an active surface facing the substrate. The encapsulant is disposed on the upper surface of the substrate. The encapsulant extends within the substrate and encapsulates the bonding wire.

19 Claims, 24 Drawing Sheets

(56) References Cited

U.S. PATENT DOCUMENTS

| | | | |
|---|---|---|---|
| 2008/0111248 A1 | 5/2008 | Foong et al. | |
| 2012/0092832 A1* | 4/2012 | Haba | H01L 24/73 |
| | | | 361/709 |
| 2012/0168960 A1* | 7/2012 | Kim | H01L 23/13 |
| | | | 257/774 |
| 2013/0015586 A1* | 1/2013 | Crisp | G11C 5/06 |
| | | | 257/784 |
| 2013/0049224 A1* | 2/2013 | Sutardja | H01L 23/49838 |
| | | | 257/774 |
| 2014/0327156 A1* | 11/2014 | Hwang | H01L 23/13 |
| | | | 257/777 |
| 2016/0172331 A1* | 6/2016 | Yu | H01L 23/5384 |
| | | | 257/773 |
| 2016/0225746 A1 | 8/2016 | Zohni et al. | |
| 2020/0006293 A1 | 1/2020 | Sankman et al. | |
| 2023/0369306 A1 | 11/2023 | Yang | |

FOREIGN PATENT DOCUMENTS

| | | |
|---|---|---|
| TW | 201630091 A | 8/2016 |
| TW | 201814800 A | 4/2018 |
| TW | 201834090 A | 9/2018 |
| TW | 202137472 A | 10/2021 |
| TW | 202145479 A | 12/2021 |

* cited by examiner

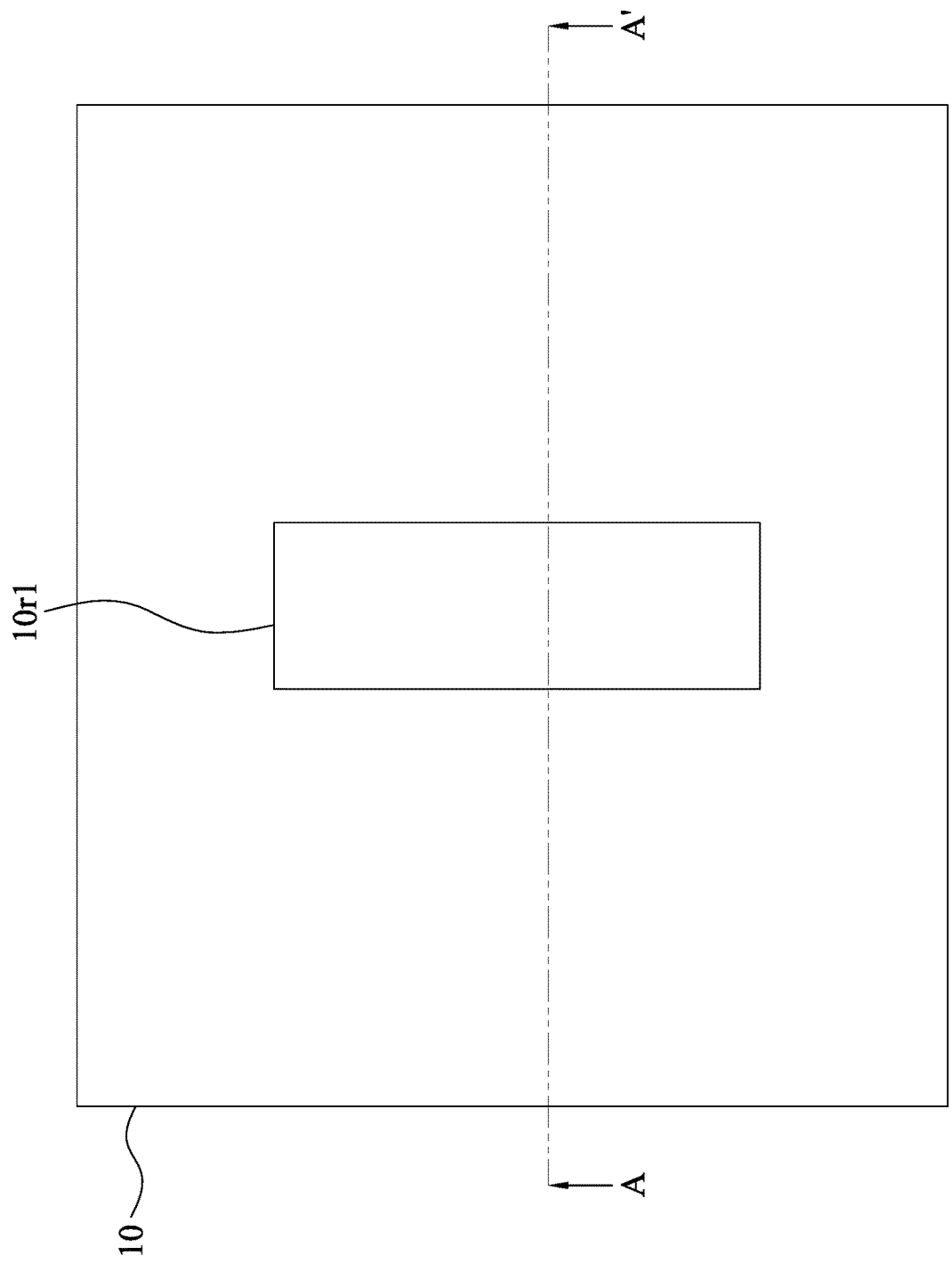

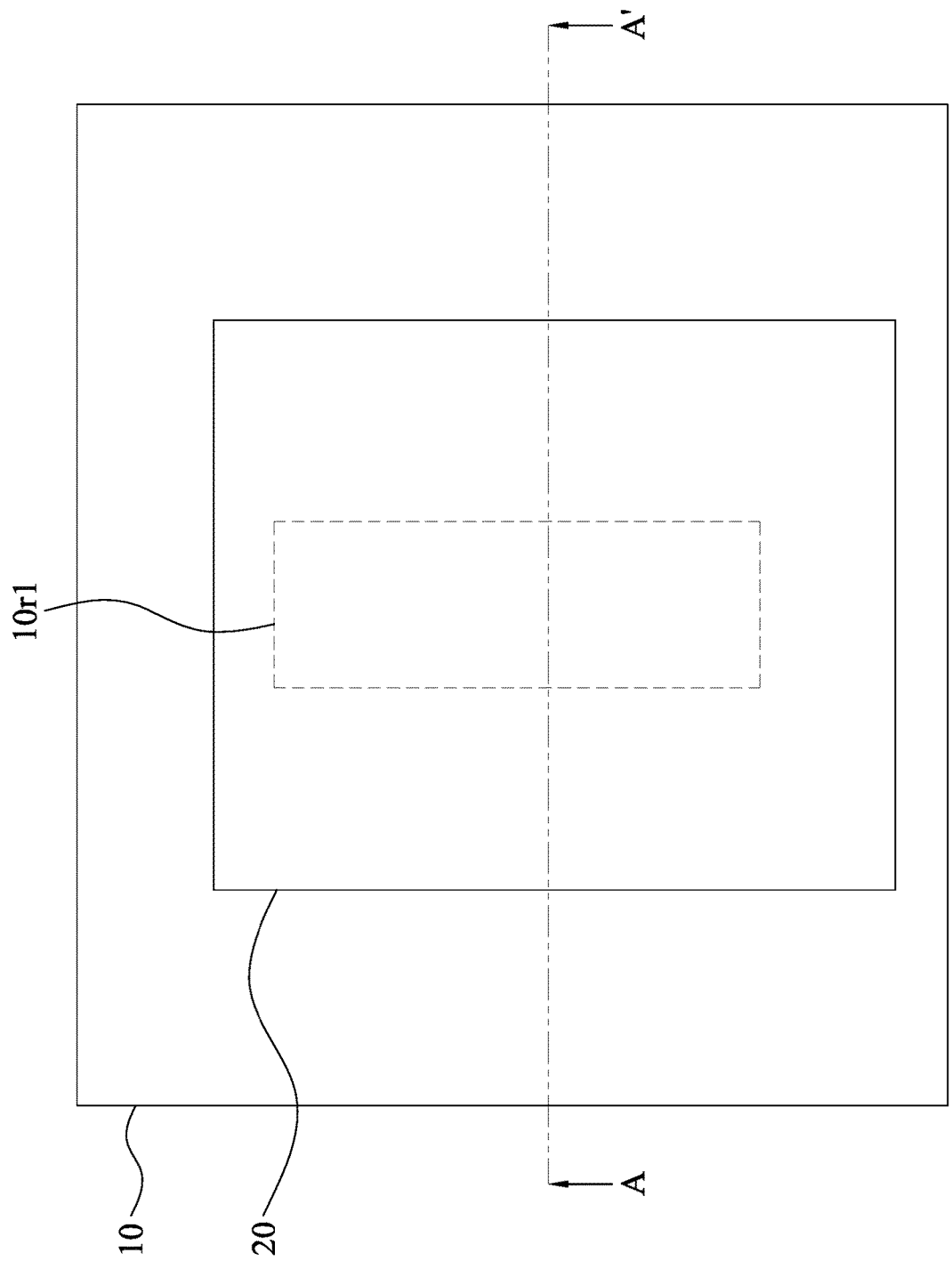

SEMICONDUCTOR DEVICE HAVING A BONDING WIRE IN A HOLE IN THE SUBSTRATE

TECHNICAL FIELD

The present disclosure relates to a semiconductor device, and more particularly, to a semiconductor device including a substrate through which a bonding wire passes.

DISCUSSION OF THE BACKGROUND

With the rapid growth of the electronics industry, integrated circuits (ICs) have achieved high performance and miniaturization. Technological advances in IC materials and design have produced generations of ICs in which each successive generation has smaller and more complex circuits.

Many techniques have been developed for integrating two electronic components. For example, electronic components may be stacked vertically in order to scale down semiconductor devices. The current stacked electronic components may utilize conductive pillars with different lengths, each of which connects the corresponding electronic component to a substrate. Such structures may require multiple semiconductor manufacturing processes, which increases production costs. Therefore, a new semiconductor device and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first electronic component, a second electronic component, a bonding wire, and an encapsulant. The substrate has a lower surface and an upper surface opposite to the lower surface. The first electronic component is disposed on the upper surface of the substrate. The bonding wire electrically connects the first electronic component and the substrate and extends within the substrate. The second electronic component is disposed on the upper surface of the substrate. The second electronic component has an active surface facing the substrate. The encapsulant is disposed on the upper surface of the substrate. The encapsulant extends within the substrate and encapsulates the bonding wire Another aspect of the present disclosure provides another semiconductor device. The semiconductor device includes a substrate, a first electronic component, a second electronic component, a bonding wire, and a plurality of conductive pillars. The substrate has a lower surface, an upper surface opposite to the lower surface, and an inner lateral surface extending between the upper surface and the lower surface. The first electronic component is disposed on the upper surface of the substrate. The bonding wire electrically connects the first electronic component and the substrate and faces the inner lateral surface of the substrate. The bonding wire extends within the substrate. The second electronic component is disposed on the upper surface of the substrate. Each of the conductive pillars is disposed on the upper surface of the substrate and electrically connects the second electronic component and the substrate.

Another aspect of the present disclosure provides a method of manufacturing a semiconductor device. The method includes providing a substrate having a lower surface and an upper surface opposite to the lower surface. The method also includes forming an opening extending between the upper surface and the lower surface of the substrate. The method further includes attaching a first electronic component to the upper surface of the substrate. An active surface of the first electronic component faces the upper surface of the substrate. In addition, the method includes attaching a second electronic component to the first electronic component. An active surface of the second electronic component faces the upper surface of the substrate. The method also includes forming a bonding wire on the substrate. The bonding wire passes through the opening of the substrate and electrically connects the substrate and one of the first electronic component or the second electronic component.

In the embodiments of the present disclosure, the substrate has an opening through which a bonding wire passes. Said bonding wire electrically connects a lower electronic component to the substrate (or connect an upper electronic component to the substrate). As a result, semiconductor manufacturing processes for formation of conductive pillars can be omitted, thereby reducing the cost and improving the device yield.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 7A illustrates one or more stages of an example of a method for manufacturing a semiconductor device according to some embodiments of the present disclosure.

FIG. 8A illustrates one or more stages of an example of a method for manufacturing a semiconductor device according to some embodiments of the present disclosure.

DETAILED DESCRIPTION

Figure 1A:
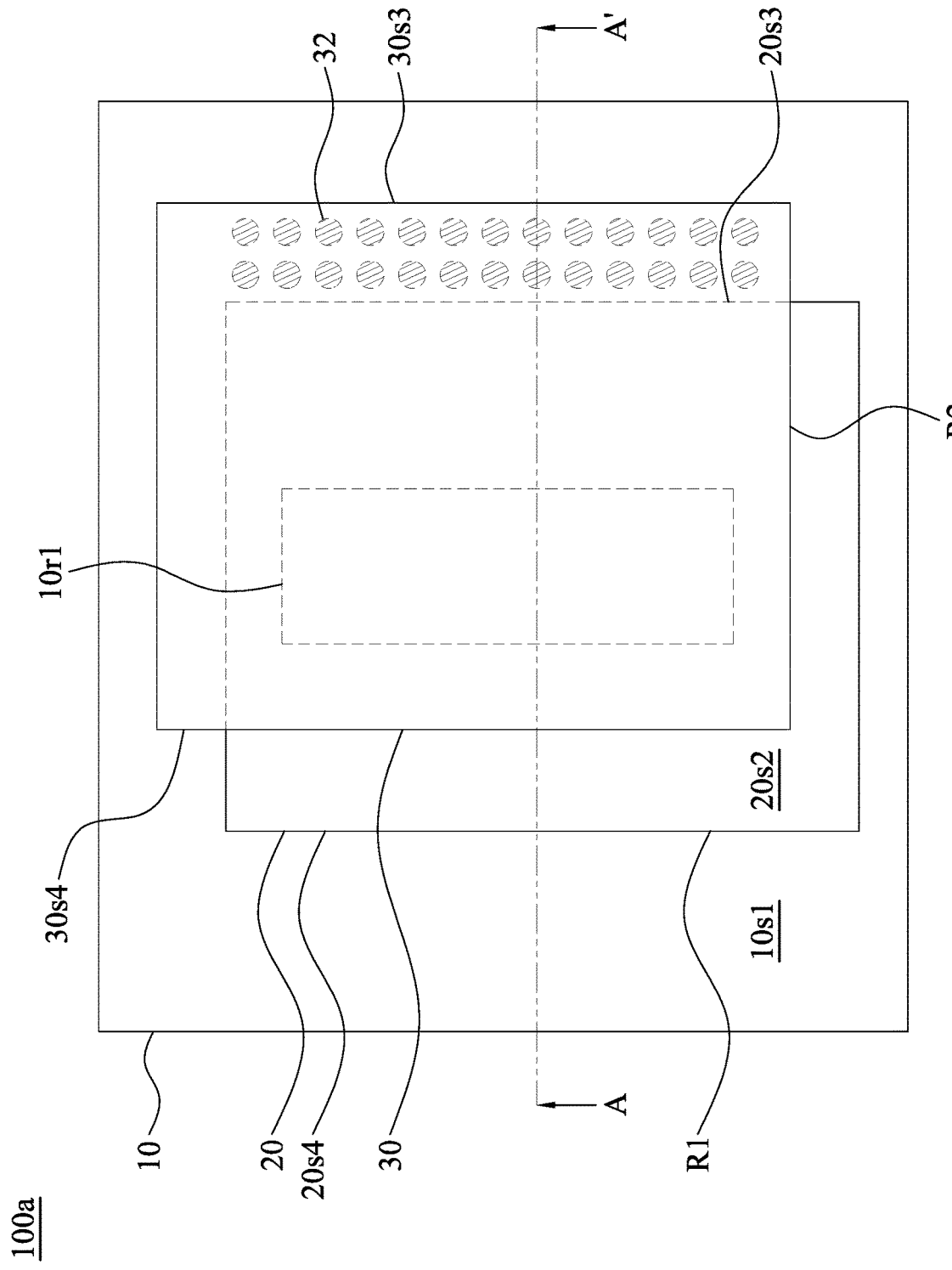
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
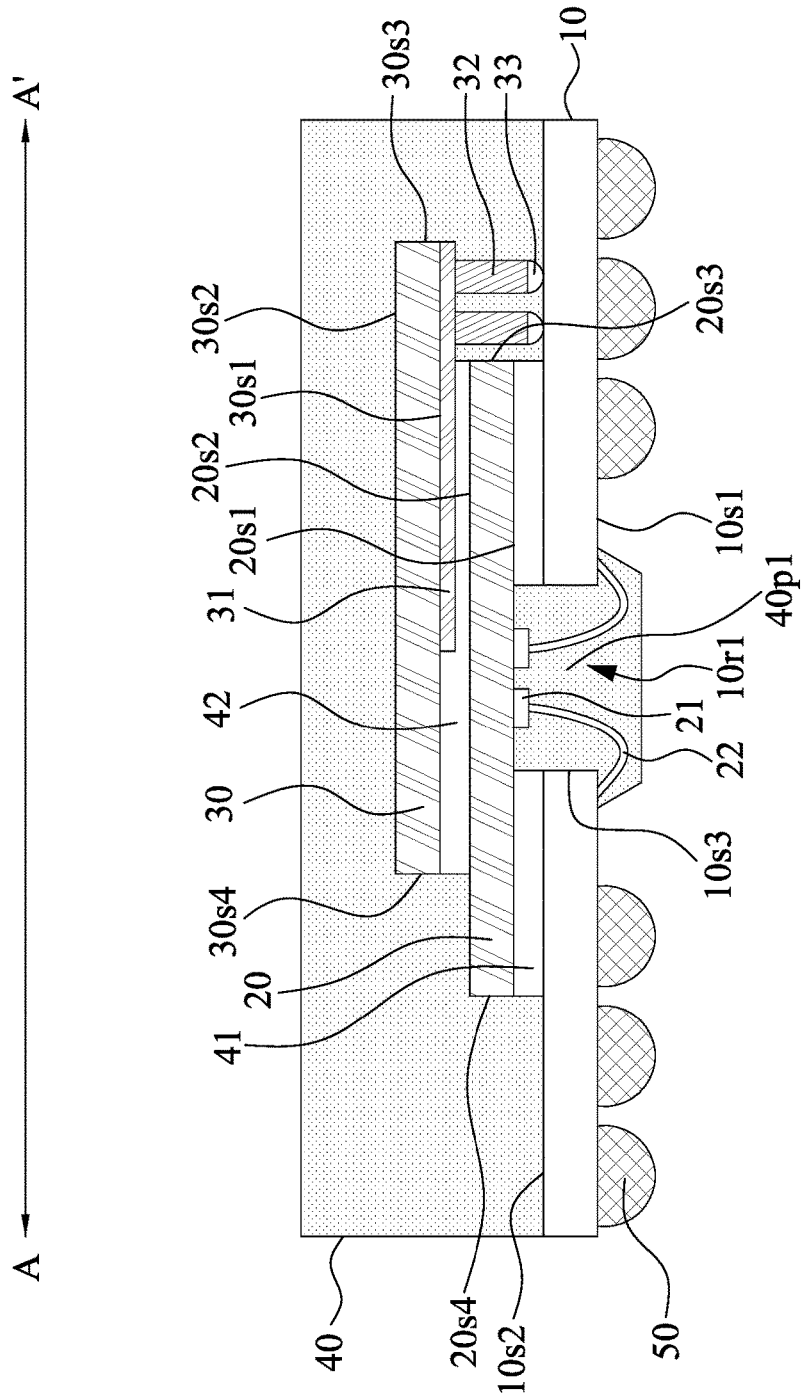
FIG. 1B is a cross-sectional view along line A-A' of the semiconductor device as shown in FIG. 1A, in accordance with some embodiments of the present disclosure.

FIG. 1A and FIG. 1B illustrate a semiconductor device 100a, in accordance with some embodiments of the present disclosure, wherein FIG. 1A is a top view, and FIG. 1B is a cross-sectional view along line A-A' of FIG. 1A.

In some embodiments, the semiconductor device 100a may include a substrate 10. In some embodiments, the substrate 10 may be or include, for example, a printed circuit board, such as a paper-based copper foil laminate, a composite copper foil laminate, or a polymer-impregnated glass-fiber-based copper foil laminate.

In some embodiments, the substrate 10 may include a surface 10s1 and a surface 10s2 opposite to the surface 10s1. In some embodiments, the surface 10s1 may also be referred to as a lower surface. In some embodiments, the surface 10s2 may also be referred to as an upper surface.

In some embodiments, the substrate 10 may include conductive pad(s), trace(s), via(s), layer(s), or other interconnection(s). For example, the substrate 10 may include one or more transmission lines (e.g., communications cables) and one or more grounding lines and/or grounding planes. For example, the substrate 10 may include one or more conductive pads (not shown) in proximity to, adjacent to, or embedded in and exposed at the surface 10s1 and/or the surface 10s2 of the substrate 10. That is, both the surfaces 10s1 and 10s2 of the substrate 10 may be utilized to electrically connect to other electronic component(s).

In some embodiments, the substrate 10 may define an opening 10r1. The opening 10r1 may extend between the surfaces 10s1 and 10s2 of the substrate 10. The opening 10r1 may penetrate the substrate 10. Although FIG. 1A illustrates that the opening 10r1 has a rectangular profile, 10r1 may have other profiles, such as a circular profile, an elliptical profile, a trapezoidal profile, or other suitable profiles based on design requirements. The substrate 10 may has a surface 10s3 defining the opening 10r1. The surface 10s3 may extend between the surfaces 10s1 and 10s2 of the substrate 10. In some embodiments, the surface 10s3 may also be referred to as an inner lateral surface. In some embodiments, the inner lateral surface may be surrounded by an outer lateral surface (not annotated in the figures) of the substrate 10.

In some embodiments, the semiconductor device 100a may include an electronic component 20. In some embodiments, the electronic component 20 may be disposed on the surface 10s2 of the substrate 10. In some embodiments, the electronic component 20 may include a memory device, such as a dynamic random access memory (DRAM) device, a one-time programming (OTP) memory device, a static random access memory (SRAM) device, or other suitable memory devices. In some embodiments, the electronic component 20 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device), a front-end device (e.g., analog front-end (AFE) devices) or other devices.

The electronic component 20 may have a surface 20s1 and a surface 20s2 opposite to the surface 20s1. In some embodiments, the surface 20s1 may also be referred to as an active surface. In some embodiments, the surface 20s2 may also be referred to as a backside surface. In some embodiments, the surface 20s1 of the electronic component 20 may face the surface 10s2 of the substrate 10. As used herein, the term "active surface" may refer to a surface on which a terminal is disposed for transmitting and/or receiving signals. In some embodiments, the surface 20s1 of the electronic component 20 may face the surface 10s2 of the substrate 10. The electronic component 20 may include a surface 20s3 and a surface 20s4 opposite to the surface 20s3. The surface 20s3 may extend between the surfaces 20s1 and 20s2. The surface 20s4 may extend between the surfaces 20s1 and 20s2. In some embodiments, each of the surfaces 20s3 and 20s4 may also be referred to as a side of the electronic component 20.

In some embodiments, the electronic component 20 may include a terminal 21. The terminal 21 may be disposed on the surface 20s1 of the electronic component 20. The terminal 21 may be, for example, a conductive pad. In some embodiments, the terminal 21 may include metal, such as copper (Cu), tungsten (W), silver (Ag), gold (Au), ruthenium (Ru), iridium (Ir), nickel (Ni), osmium (Os), ruthenium (Rh), aluminum (Al), molybdenum (Mo), cobalt (Co), alloys thereof, combinations thereof or other suitable materials.

In some embodiments, the semiconductor device 100a may include a bonding wire 22. In some embodiments, the bonding wire 22 has a first end (not annotated in the figures) bonded to the surface 10s1 of the substrate 10 and a second end (not annotated in the figures) bonded to the surface 20s1 of the electronic component 20. In some embodiments, the bonding wire 22 may be bonded to the terminal 21 of the electronic component 20. In some embodiments, the bonding wire 22 may pass through the opening 10r1 of the substrate 10. In some embodiments, the bonding wire 22 may face the surface 10s3 of the substrate 10. In some embodiments, the bonding wire 22 may penetrate the substrate 10. In some embodiments, the bonding wire 22 may include metal, such as copper (Cu), silver (Ag), gold (Au), nickel (Ni), aluminum (Al), alloys thereof, combinations thereof or other suitable materials.

In some embodiments, the semiconductor device 100a may include an electronic component 30. In some embodiments, the electronic component 30 may be disposed on the surface 10s2 of the substrate 10. In some embodiments, the electronic component 30 may be located over the electronic component 20. In some embodiments, the electronic component 30 may be stacked on the electronic component 20.

In some embodiments, the electronic component 30 may be disposed on the surface 20s2 of the electronic component 20. In some embodiments, the electronic component 30 may include a memory device, such as a dynamic random access memory (DRAM) device, a one-time programming (OTP) memory device, a static random access memory (SRAM) device, or other suitable memory devices. In some embodiments, the electronic component 30 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device), a front-end device (e.g., analog front-end (AFE) devices) or other devices.

The electronic component 30 may have a surface 30s1 and a surface 30s2 opposite to the surface 30s1. In some embodiments, the surface 30s1 may also be referred to as an active surface. In some embodiments, the surface 30s2 may also be referred to as a backside surface. In some embodiments, the surface 30s1 of the electronic component 30 may face the surface 10s2 of the substrate 10. In some embodiments, the surface 30s1 of the electronic component 30 may face the surface 20s2 of the electronic component 20. The electronic component 30 may have a surface 30s3 and a surface 30s4 opposite to the surface 30s3. The surface 30s3 may extend between the surfaces 30s1 and 30s2. The surface 30s4 may extend between the surfaces 30s1 and 30s2. In some embodiments, each of the surface 30s3 and 30s4 may also be referred to as a side of the electronic component 30.

As shown in FIG. 1A, the electronic component 20 may have a surface area R1, and the electronic component 30 may have a surface area R2. In some embodiments, the surface area R1 may be substantially equal to the surface area R2. In some embodiments, the geometry center (not annotated in the figures) of the electronic component 20 is misaligned from that of the electronic component 30. In some embodiments, a portion of the surface 20s2 of the electronic component 20 may be exposed from the electronic component 30. In some embodiments, the electronic component 30 may vertically overlap the opening 10r1 of the substrate 10. In some embodiments, the electronic component 30 may cover the opening 10r1 of the substrate 10.

In some embodiments, the electronic component 30 may include a circuit layer 31. The circuit layer 31 may be disposed on the surface 30s1 of the electronic component 30. The circuit layer 31 may include, for example, a redistribution layer, which has trace(s) and conductive via(s) within in one or more dielectric layers.

In some embodiments, the semiconductor device 100a may include conductive pillars 32. In some embodiments, the conductive pillars 32 may be disposed on the surface 30s1 of the electronic component 30. In some embodiments, the conductive pillar of the electronic component 30 may be configured to electrically connect the electronic component 30 and the substrate 10. In some embodiments, the conductive pillar 32 may include metal, such as copper (Cu), silver (Ag), gold (Au), nickel (Ni), aluminum (Al), alloys thereof, combinations thereof or other suitable materials.

As shown in FIG. 1A, the conductive pillars 32 may face the surface 20s3 of the electronic component 20. In some embodiments, the surface 20s4 of the electronic component 20 may face away from the conductive pillars 32.

In some embodiments, the semiconductor device 100a may include electrical connections 33. The electrical connection 33 may be disposed between the conductive pillar 32 and the substrate 10. The electrical connection 33 may include a solder material, such as alloys of gold and tin solder or alloys of silver and tin solder.

In some embodiments, the semiconductor device 100a may include an encapsulant 40. In some embodiments, the encapsulant 40 may be disposed on the surface 10s2 of the substrate 10. In some embodiments, the encapsulant 40 may cover the surface 10s2 of the substrate 10. In some embodiments, the encapsulant 40 may cover a portion of the surface 10s1 of the substrate 10. In some embodiments, a portion of the surface 10s1 of the substrate 10 may be exposed from the encapsulant 40. The encapsulant 40 may include insulation or dielectric material. In some embodiment, the encapsulant 40 be made of molding material that may include, for example, a Novolac-based resin, an epoxy-based resin, a silicone-based resin, or another suitable encapsulant. Suitable fillers may also be included, such as powdered $SiO_2$.

In some embodiments, the encapsulant 40 may encapsulate the electronic component 20. In some embodiments, the encapsulant 40 may encapsulate the electronic component 30. In some embodiments, the encapsulant 40 may encapsulate the bonding wire 22. In some embodiments, the encapsulant 40 may encapsulate the conductive pillars 32. In some embodiments, the encapsulant 40 may encapsulate the electrical connections 33. In some embodiments, the encapsulant may fill the opening 10r1 of the substrate 10. In some embodiments, the encapsulant 40 may protrude into the substrate 10. In some embodiments, the encapsulant 40 may have a portion 40p1 within the opening 10r1 of the substrate 10. In some embodiments, the portion 40p1 of the encapsulant 40 may be surrounded by the substrate 10. In some embodiments, the portion 40p1 of the encapsulant 40 may be surrounded by the surface 10s3 of the substrate 10. In some embodiments, the portion 40p1 of the encapsulant 40 may be in contact with the surface 10s3 of the substrate 10. In some embodiments, the portion 40p1 of the encapsulant 40 may vertically overlap the electronic component 20. In some embodiments, the portion 40p1 of the encapsulant 40 may vertically overlap the electronic component 30.

In some embodiments, the semiconductor device 100a may include adhesives 41 and 42. In some embodiments, the adhesive 41 may be configured to attach the electronic component 20 to the surface 10s2 of the substrate 10. In some embodiments, the adhesive 41 may be disposed between the surface 20s1 of the electronic component 20 and the surface 10s2 of the substrate 10.

In some embodiments, the adhesive 42 may be configured to attach the electronic component 30 to the surface 20s2 of the electronic component 20. In some embodiments, the adhesive 42 may be disposed between the surface 20s2 of the electronic component 20 and the surface 30s2 of the electronic component 30. In some embodiments, a portion of the circuit layer 31 may be covered by the adhesive 42. In some embodiments, a portion of the circuit layer 32 may be exposed from the adhesive 42.

In some embodiments, the semiconductor device 100a may include electrical connections 50. The electrical connections 50 may be disposed on the surface 10s1 of the substrate 10. In some embodiments, the electrical connection 50 may be configured to electrically connect the semiconductor device 100a and an external device (not shown). In some embodiments, the electrical connection 50 may include a solder material, such as alloys of gold and tin solder or alloys of silver and tin solder.

In a comparative example, both the lower and upper electronic components are electrically connected to the substrate through conductive pillars. Said conductive pillars have different lengths. For example, shorter conductive pillars connect the lower electronic component to the substrate, and longer conductive pillars connect the upper electronic component to the substrate. The formation of the conductive pillars on the electronic component may require more semiconductor manufacturing processes, which may cause the cost to be much higher, and the yield to be relatively low.

In the embodiments of the present disclosure, the substrate has an opening (e.g., 10r1) through which a bonding wire (e.g., 22) passes. Said bonding wire electrically connects the lower electronic component (e.g., 20) to the substrate. The upper electronic component (e.g., 30) is electrically connected to the substrate through conductive pillars (e.g., 32). In comparison with the comparative example, only the upper electronic component needs conductive pillars. As a result, semiconductor manufacturing processes for formation of shorter conductive pillars can be omitted, thereby reducing the cost and improving the device yield.

Figure 2:
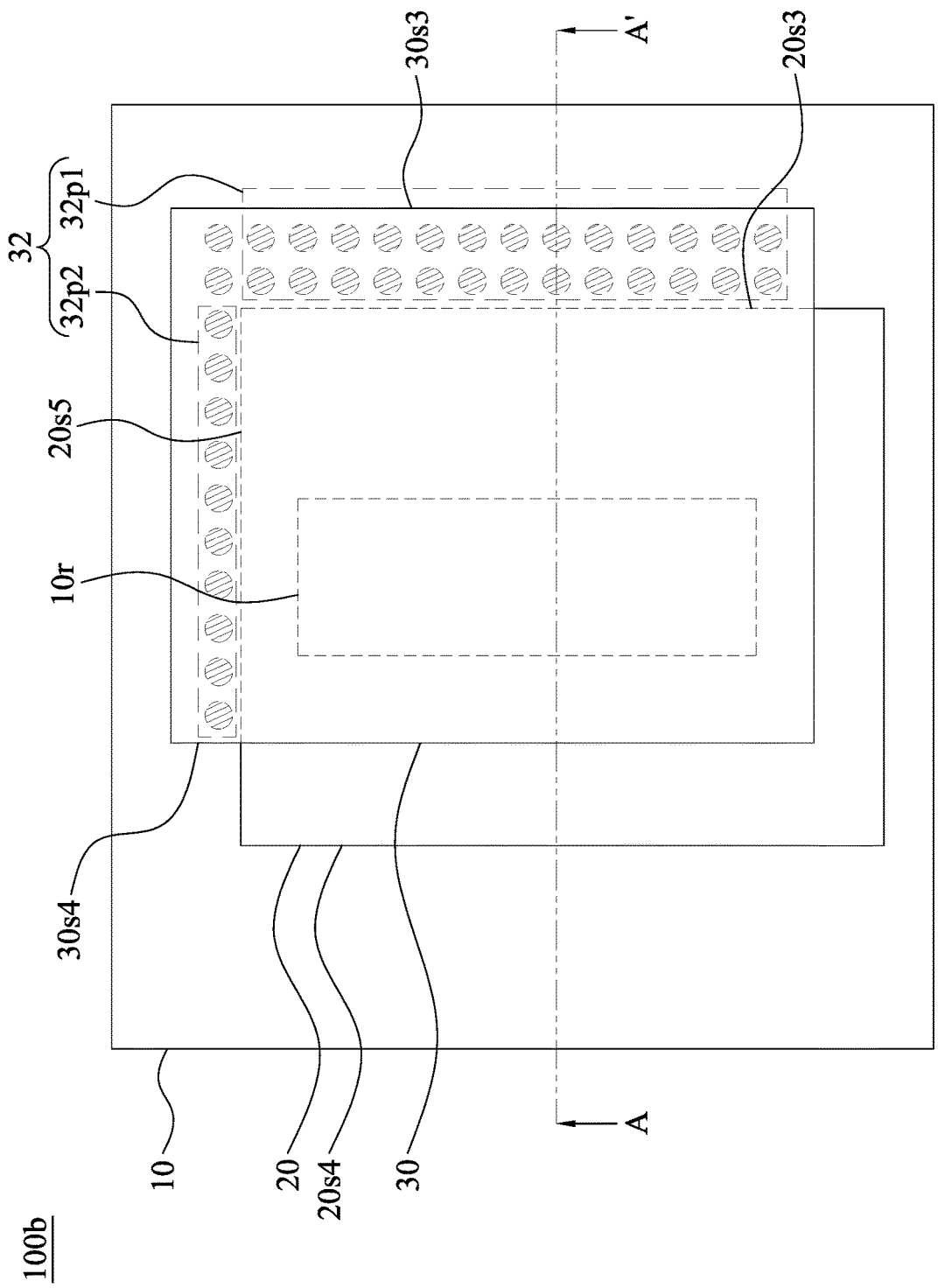
FIG. 2 is a top view of a semiconductor device, in accordance with some embodiments of the present disclosure.

FIG. 2 is a top view of a semiconductor device 100b, in accordance with some embodiments of the present disclosure. The semiconductor device 100b is similar to the semiconductor device 100a as shown in FIG. 1A, and the differences therebetween are described below.

As shown in FIG. 2, the electronic component 20 may have a surface 20s5 extending between the surfaces 20s3 and 20s4. The surface 20s5 may also be referred to as a side of the electronic component 20.

In some embodiments, the conductive pillars 32 may include portions 32p1 and 32p2. In some embodiments, the portion 32p1 of the conductive pillars 32 may be disposed on the surface 20s3 of the electronic component 20. In some embodiments, the portion 32p1 of the conductive pillars 32 may face the surface 20s3 of the electronic component 20. In some embodiments, the portion 32p2 of the conductive pillars 32 may be disposed on the surface 20s5 of the electronic component 20. In some embodiments, the portion 32p2 of the conductive pillars 32 may face the surface 20s5 of the electronic component 20.

A portion of the surface 20s5 of the electronic component 20 may be free from overlapping the conductive pillars 32. In some embodiments, the conductive pillars 32 may be arranged in an L-shaped profile, reversed L-shaped profile, or other suitable profiles.

Since there are more conductive pillars (e.g., portion 32p2) connecting the electronic component 30 and the substrate 10, more input and/or output terminals may be utilized to transmit or receive signals, which thereby enhances the performance of the semiconductor device 100b.

Figure 3:
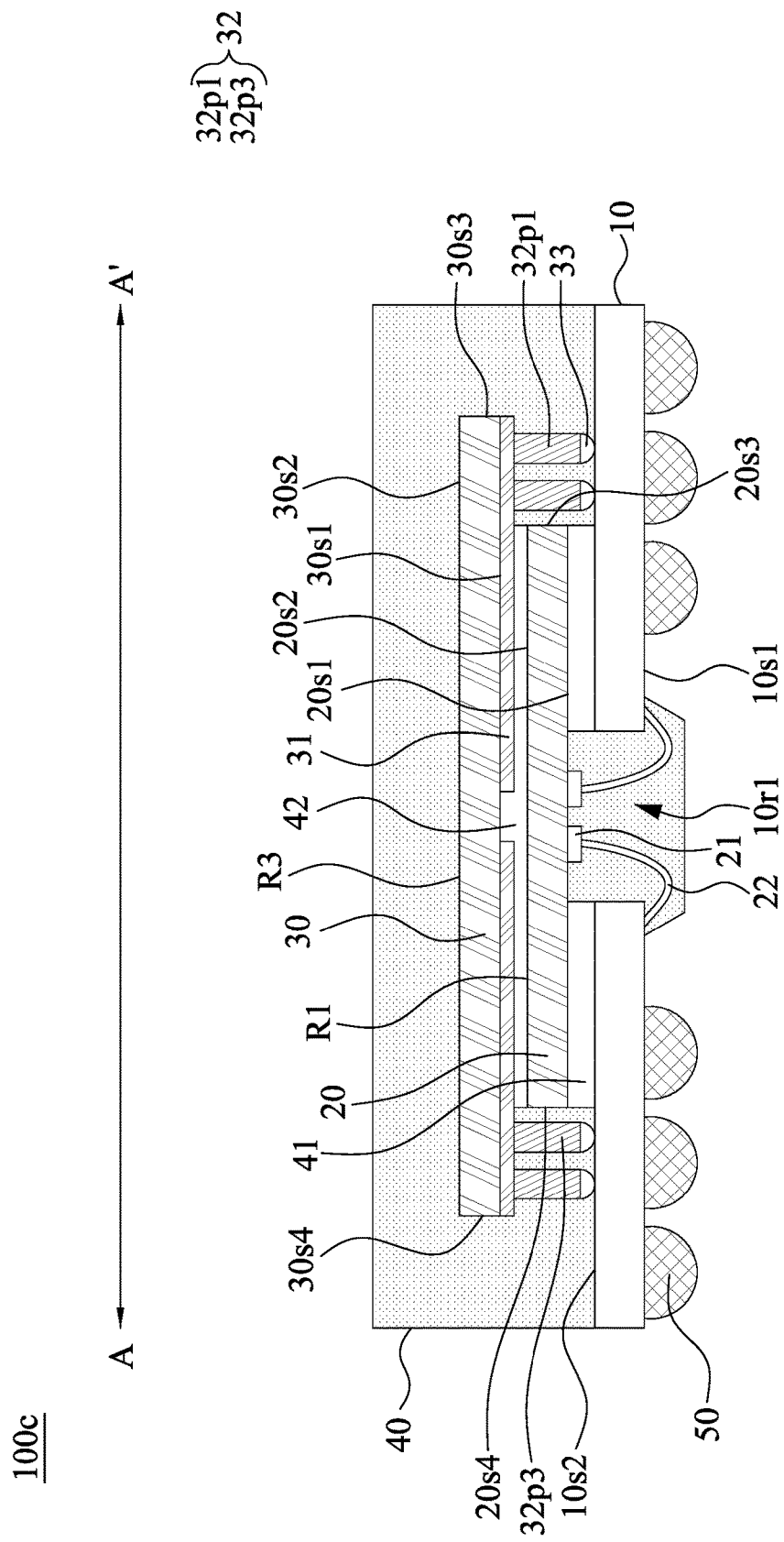
FIG. 3 is a cross-sectional view of a semiconductor device, in accordance with some embodiments of the present disclosure.

FIG. 3 is a cross-sectional view of a semiconductor device 100c, in accordance with some embodiments of the present disclosure. The semiconductor device 100c is similar to the semiconductor device 100a as shown in FIG. 1B, and the differences therebetween are described below.

In some embodiments, a surface area R3 of the electronic component 30 may be different from the surface area of the R1 of the electronic component 20. In some embodiments, the surface area R3 of the electronic component 30 may be greater than the surface area of the R1 of the electronic component 20.

In some embodiments, the conductive pillars 32 may include a portion 32p3. In some embodiments, the portions 32p1 and 32p3 of the conductive pillars 32 may be disposed on opposite sides of the electronic component 20. In some embodiments, the portion 32p3 of the conductive pillars 32 may be disposed on the surface 20s4 of the electronic component 20. In some embodiments, the portion 32*p*3 of the conductive pillars 32 may face the surface 20*s*4 of the electronic component 20.

Since there are more conductive pillars (e.g., portion 32*p*3) connecting the electronic component 30 and the substrate 10, more input and/or output terminals may be utilized to transmit or receive signals, which thereby enhances the performance of the semiconductor device 100*c*.

Figure 4:
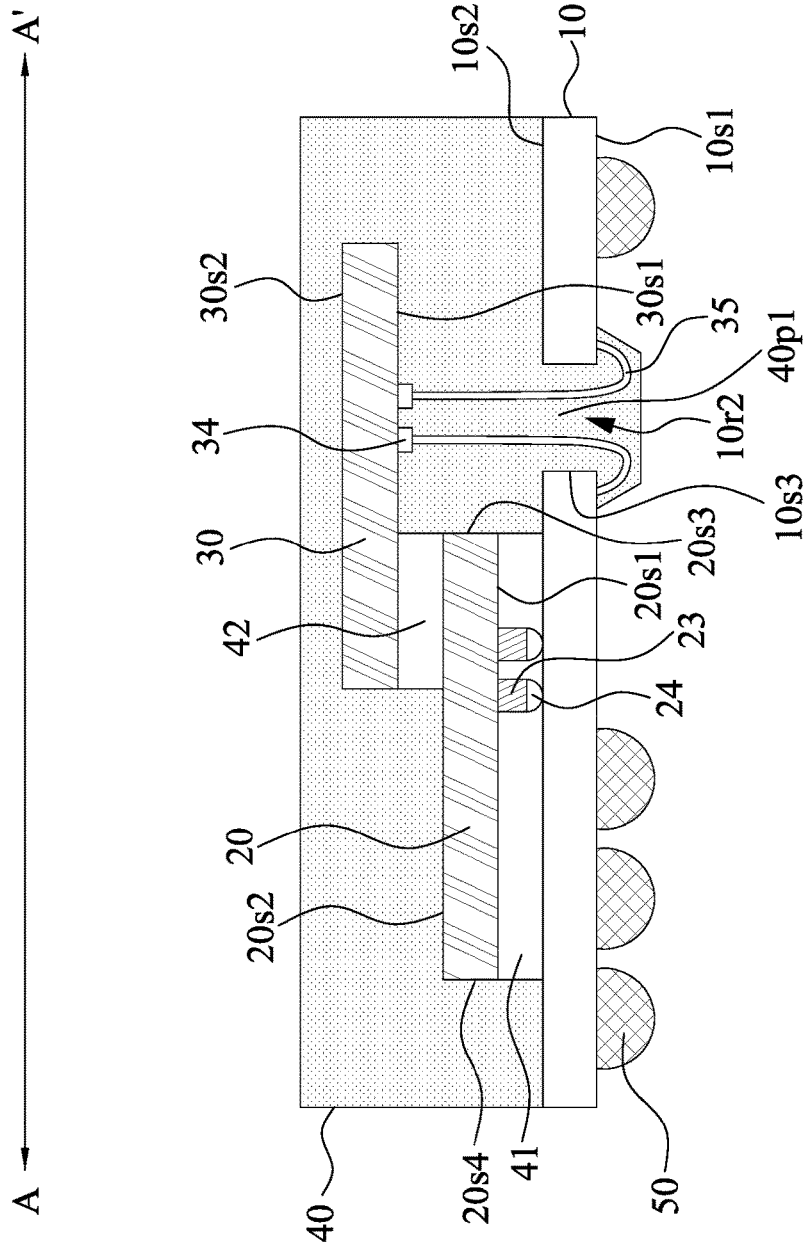
FIG. 4 is a cross-sectional view of a semiconductor device, in accordance with some embodiments of the present disclosure.

FIG. 4 is a cross-sectional view of a semiconductor device 100*d*, in accordance with some embodiments of the present disclosure. The semiconductor device 100*d* is similar to the semiconductor device 100*a* as shown in FIG. 1B, and the differences therebetween are described below.

In some embodiments, the substrate 10 may have an opening 10*r*2. The opening 10*r*2 may extend between the surfaces 10*s*1 and 10*s*2 of the substrate 10. In some embodiments, the opening 10*r*2 may be free from vertically overlapping the electronic component 20.

In some embodiments, the electronic component 20 may be electrically connected to the substrate 10 through conductive pillars 23. In some embodiments, the conductive pillars 23 may be disposed between the surface 20*s*1 of the electronic component 20 and the surface 10*s*2 of the substrate 10. In some embodiments, the conductive pillars 23 may include metal, such as copper (Cu), silver (Ag), gold (Au), nickel (Ni), aluminum (Al), alloys thereof, combinations thereof or other suitable materials.

In some embodiments, the encapsulant 40 may have a portion 40*p*1 within the opening 10*r*2 of the substrate 10. In some embodiments, the portion 40*p*1 of the encapsulant 40 may be vertically free from overlapping the electronic component 20. In some embodiments, the portion 40*p*1 of the encapsulant 40 may vertically overlap the electronic component 30.

In some embodiments, the semiconductor device 100*a* may include electrical connections 24. The electrical connections 24 may be disposed between the conductive pillars 23 and the substrate 10. The electrical connection 24 may include a solder material, such as alloys of gold and tin solder or alloys of silver and tin solder.

In some embodiments, the electronic component 30 may include terminals 34. The terminal 34 may be disposed on the surface 30*s*1 of the electronic component 30. The material of the terminal 34 may be the same as or similar to that of the terminal 21.

In some embodiments, the semiconductor device 100*d* may include a bonding wire 35. In some embodiments, the bonding wire 35 has a first end (not annotated in the figures) bonded to the surface 10*s*1 of the substrate 10 and a second end (not annotated in the figures) bonded to the surface 30*s*1 of the electronic component 30. In some embodiments, the bonding wire 35 may be bonded to the terminal 34 of the electronic component 30. In some embodiments, the bonding wire 35 may pass through the opening 10*r*2 of the substrate 10. In some embodiments, the bonding wire 35 may face the surface 10*s*3 of the substrate 10. In some embodiments, the material of the bonding wire may be the same as or similar to that of the bonding wire 22. In some embodiments, the bonding wire 35 may face the surface 20*s*3 of the electronic component 20. In some embodiments, the surface 20*s*4 of the electronic component 20 may face away from the bonding wire 35.

In the embodiments of the present disclosure, the substrate has an opening (e.g., 10*r*2) through which a bonding wire (e.g., bonding wire 35) passes. Said bonding wire electrically connects the upper electronic component (e.g., 30) to the substrate. The lower electronic component (e.g., 20) is electrically connected to the substrate through conductive pillars (e.g., 23). In comparison with the comparative example, only the lower electronic component needs conductive pillars. As a result, semiconductor manufacturing processes for formation of longer conductive pillars can be omitted, thereby reducing the cost and improving the device yield.

Figure 5:
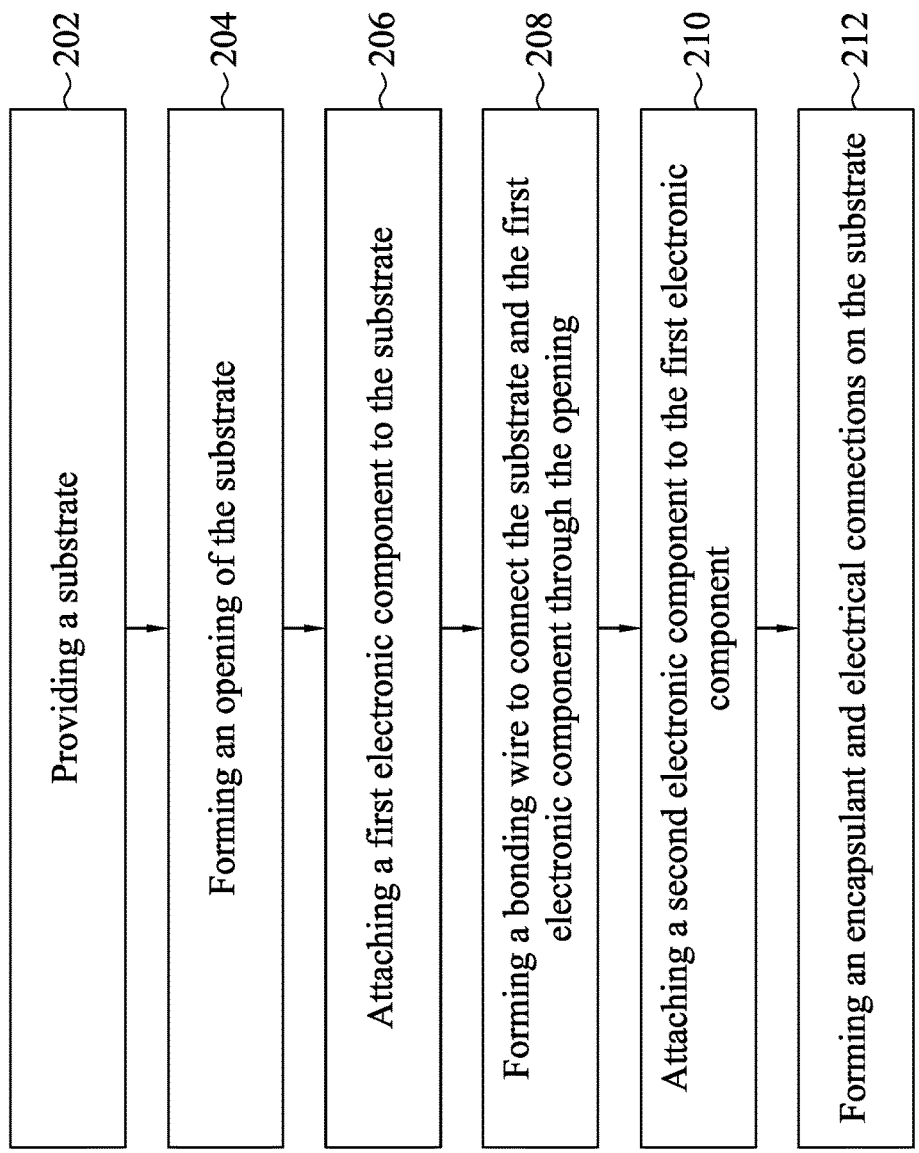
FIG. 5 is a flowchart illustrating a method of manufacturing a semiconductor device, in accordance with some embodiments of the present disclosure.

FIG. 5 is a flowchart illustrating a method 200 of manufacturing a semiconductor device, in accordance with some embodiments of the present disclosure.

The method 200 begins with operation 202 in which a substrate may be provided. The substrate may have a lower surface and an upper surface opposite to the lower surface. The substrate may include one or more conductive pads (not shown) in proximity to, adjacent to, or embedded in and exposed at the lower surface and/or the upper surface of the substrate.

The method 200 continues with operation 204 in which an opening may be formed. In some embodiments, an etching process may be performed to form the opening. The opening may extend between the lower surface and upper surface of the substrate. The etching process may include, for example, dry etching, wet etching, or other suitable processes.

The method 200 continues with operation 206 in which a first electronic component may be attached to the upper surface of the substrate. In some embodiments, the first electronic component may be attached to the upper surface of the substrate through an adhesive. In some embodiments, the first electronic component may be located directly above the opening of the substrate. The first electronic component may have an active surface and a backside surface opposite to the active surface. In some embodiments, the first electronic component may have a terminal facing the upper surface of the substrate.

The method 200 continues with operation 208 in which a bonding wire may be formed to electrically connect the substrate and the first electronic component. In some embodiments, the bonding wire may have a first end bonded to the active surface of the first electronic component and a second end bonded to the lower surface of the substrate. In some embodiments, the bonding wire may pass through the opening of the substrate. In some embodiments, the bonding wire may be bonded to the terminal of the first electronic component.

The method 200 continues with operation 210 in which a second electronic component may be attached to the backside surface of the first electronic component. In some embodiments, the second electronic component may be attached to the backside surface of the first electronic component through an adhesive. In some embodiments, the second electronic component may be located directly above the opening of the substrate.

The second electronic component may have an active surface and a backside surface opposite to the active surface. In some embodiments, a plurality of conductive pillars may be formed on the active surface of the second electronic component. The conductive pillars may electrically connect the second electronic component to the substrate. In some embodiments, the conductive pillars may be formed on the active surface of the second electronic component before attaching the second electronic component to the first electronic component.

The method 200 continues with operation 212 in which an encapsulant may be formed on the upper surface of the substrate, and electrical connections may be formed on the lower surface of the substrate, which thereby produces a semiconductor device. In some embodiments, the encapsulant may encapsulate the first electronic component, the second electronic component, and conductive pillars.

In the embodiments of the present disclosure, the substrate has an opening through which a bonding wire passes. Said bonding wire electrically connects the lower electronic component to the substrate. The upper electronic component is electrically connected to the substrate through conductive pillars. In comparison with the comparative example, only the upper electronic component needs conductive pillars. As a result, semiconductor manufacturing processes for formation of shorter conductive pillars on the lower electronic component can be omitted, thereby reducing the cost and improving the device yield.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 5. In some embodiments, the method 200 can include one or more operations depicted in FIG. 5.

FIG. 6A, FIG. 6B, FIG. 7A, FIG. 7B, FIG. 8A, FIG. 8B, FIG. 9A, FIG. 9B. FIG. 10A, FIG. 10B, FIG. 11A, and FIG. 11B illustrate one or more stages of an example of a method for manufacturing a semiconductor device according to some embodiments of the present disclosure, wherein FIG. 6A, FIG. 7A, FIG. 8A, FIG. 9A, FIG. 10A, and FIG. 11A are top views, and FIG. 6B, FIG. 7B, FIG. 8B, FIG. 9B, FIG. 10B, and FIG. 11B are cross-sectional views along line A-A' of FIG. 6A, FIG. 7A, FIG. 8A, FIG. 9A, FIG. 10A, and FIG. 11A, respectively. In some embodiments, the semiconductor device 100a may be manufactured through the operations described with respect to FIG. 6A to FIG. 11A and FIG. 6B to FIG. 11B.

Figure 6A:
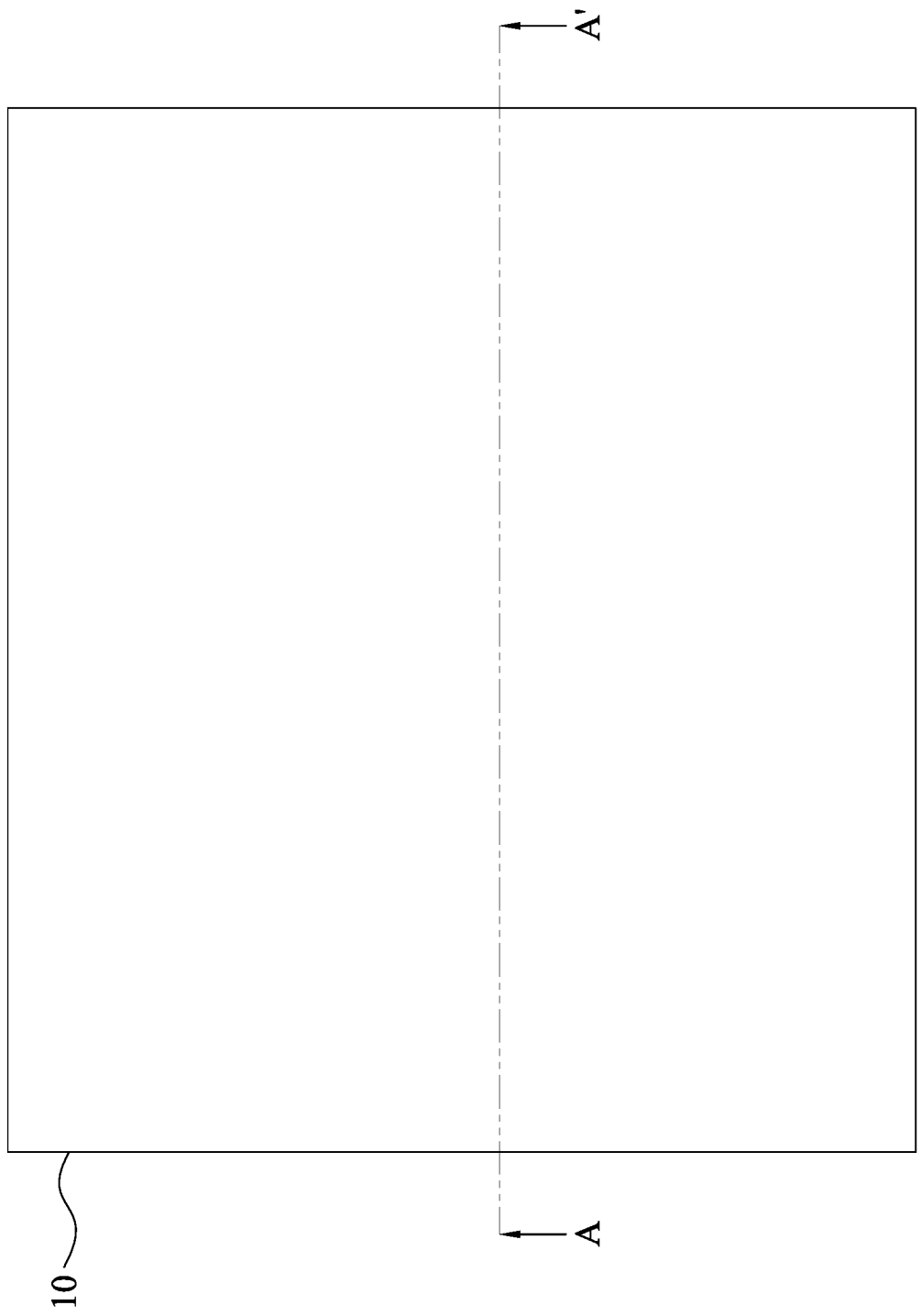
FIG. 6A illustrates one or more stages of an example of a method for manufacturing a semiconductor device according to some embodiments of the present disclosure.
Figure 6B:
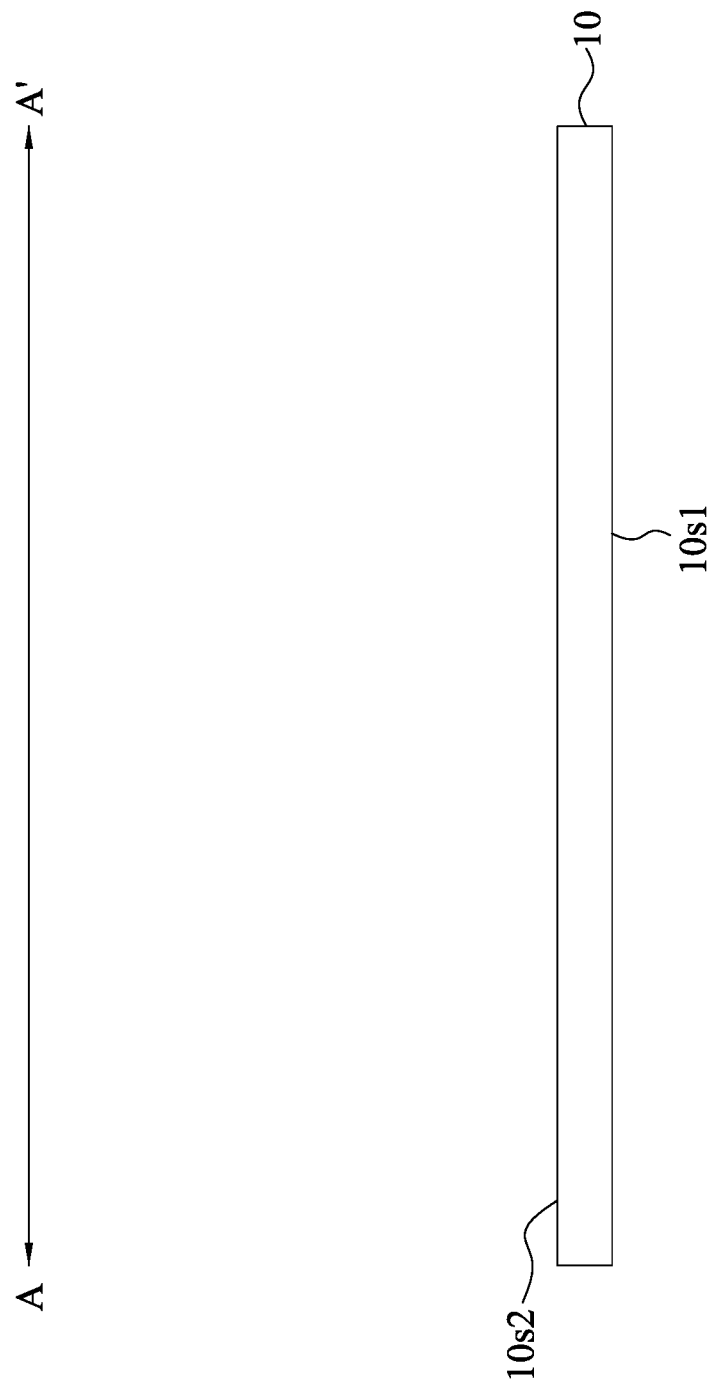
FIG. 6B is a cross-sectional view along line A-A' of the semiconductor device as shown in FIG. 6A, in accordance with some embodiments of the present disclosure.

Referring to FIG. 6A and FIG. 6B, a substrate 10 may be provided. The substrate 10 may have a surface $10s1$ and a surface $10s2$ opposite to the surface $10s1$. The substrate 10 may include one or more conductive pads (not shown) in proximity to, adjacent to, or embedded in and exposed at the surface $10s1$ and/or the surface $10s2$ of the substrate 10.

Figure 7B:
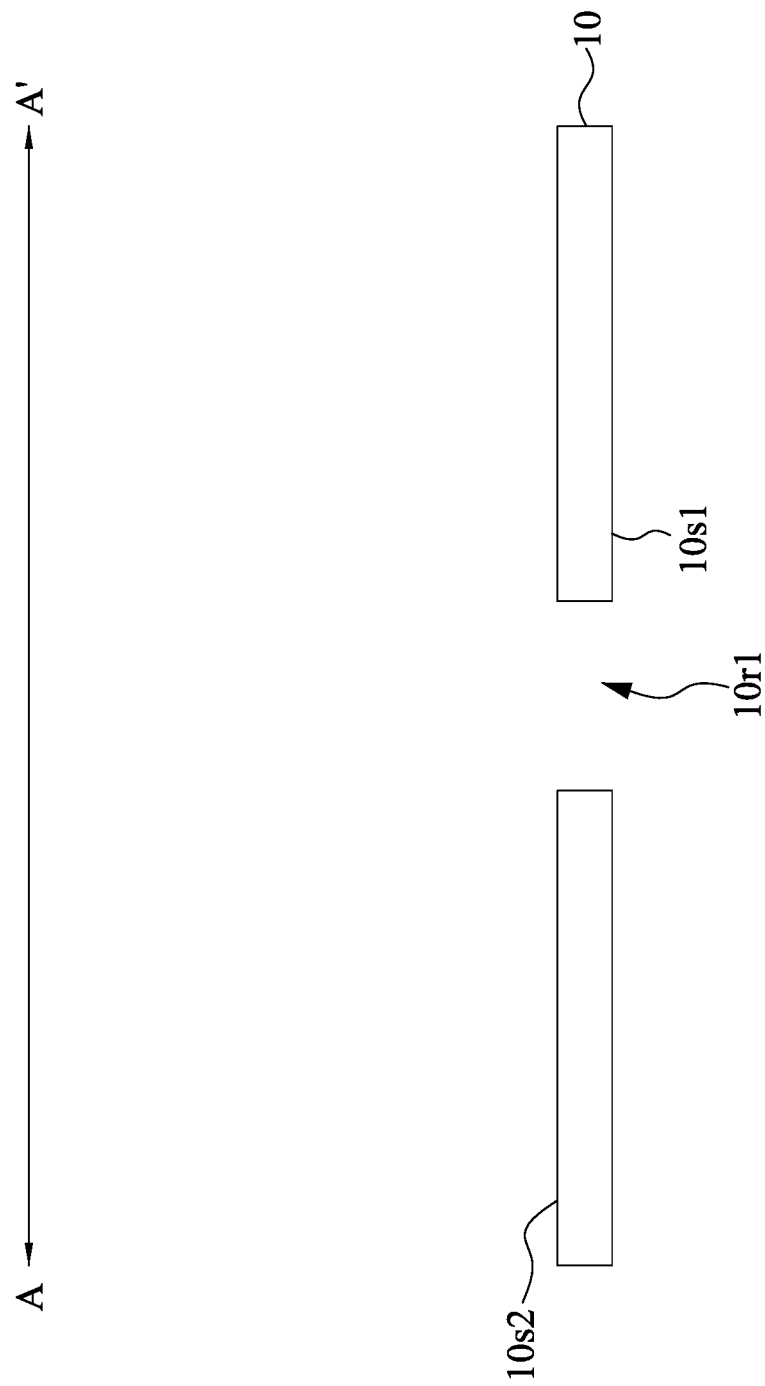
FIG. 7B is a cross-sectional view along line A-A' of the semiconductor device as shown in FIG. 7A, in accordance with some embodiments of the present disclosure.

Referring to FIG. 7A and FIG. 7B, an opening $10r1$ may be formed. In some embodiments, an etching process may be performed to form the opening $10r1$. The opening $10r1$ may extend between the surfaces $10s1$ and $10s2$ of the substrate 10. The etching process may include, for example, dry etching, wet etching, or other suitable processes.

Figure 8B:
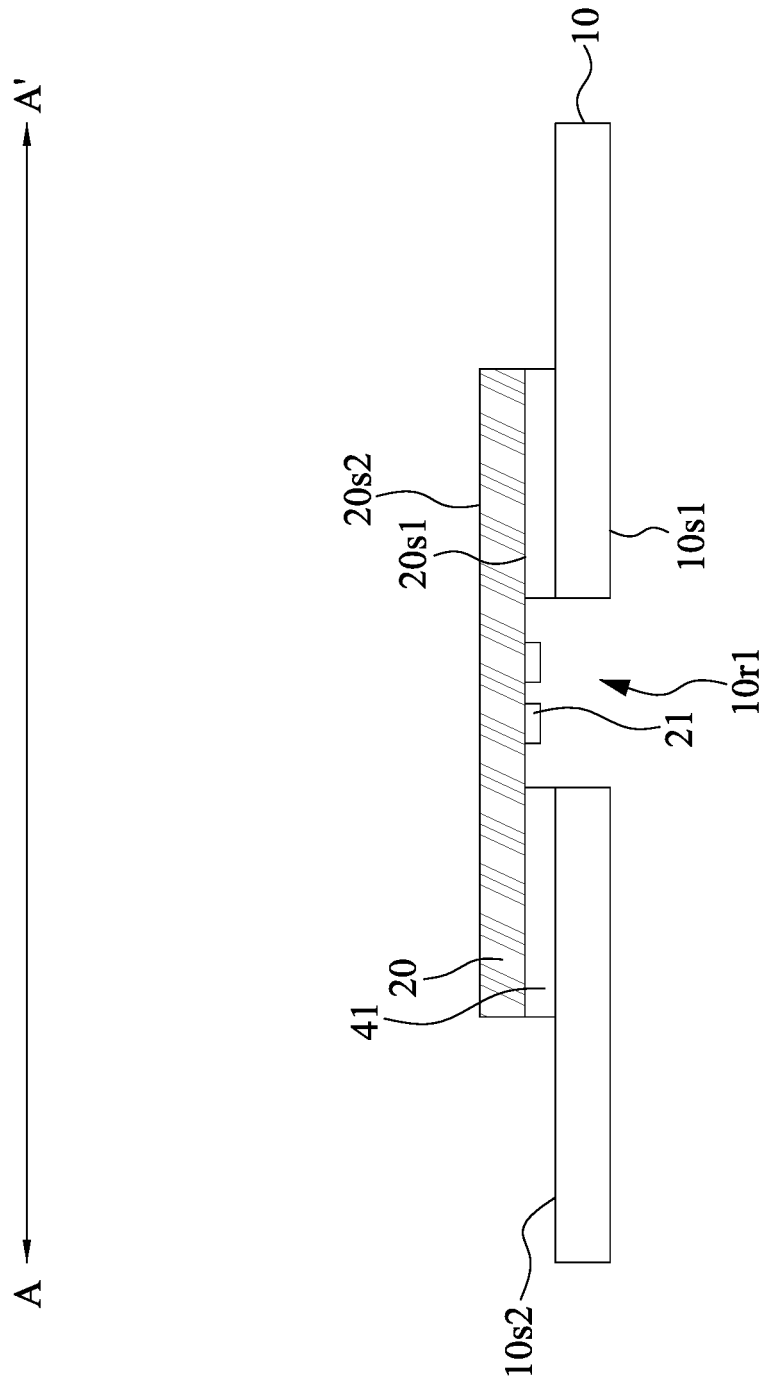
FIG. 8B is a cross-sectional view along line A-A' of the semiconductor device as shown in FIG. 8A, in accordance with some embodiments of the present disclosure.

Referring to FIG. 8A and FIG. 8B, an electronic component 20 may be attached to the surface $10s2$ of the substrate 10. In some embodiments, the electronic component 20 may be attached to the surface $10s2$ of the substrate 10 through an adhesive 41. In some embodiments, the electronic component 20 may be located directly above the opening $10r1$ of the substrate 10. The electronic component may have a surface $20s1$ and a surface $20s2$ opposite to the surface $20s1$. In some embodiments, the electronic component 20 may have a terminal 21 facing the surface $10s2$ of the substrate 10.

Figure 9A:
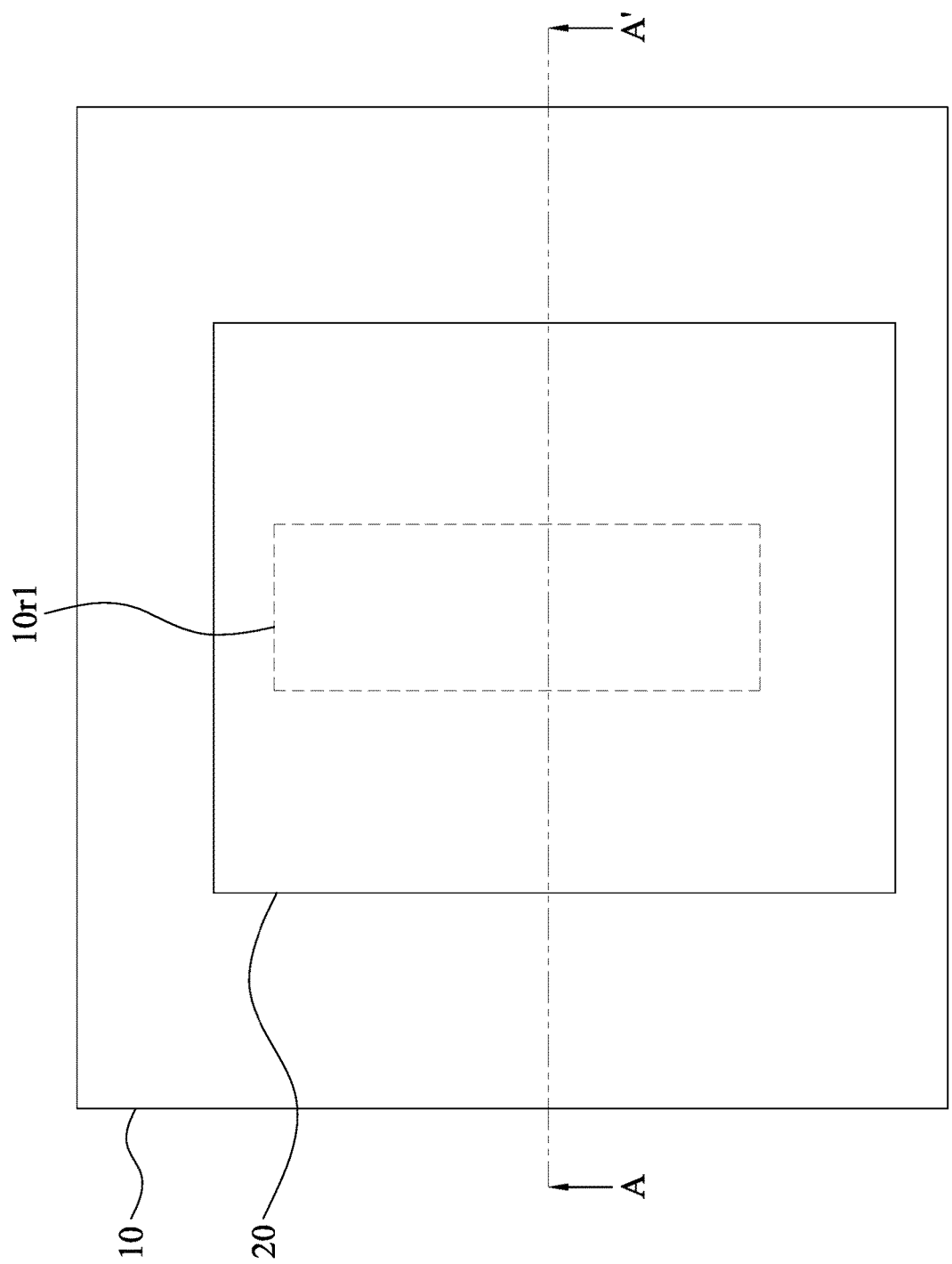
FIG. 9A illustrates one or more stages of an example of a method for manufacturing a semiconductor device according to some embodiments of the present disclosure.
Figure 9B:
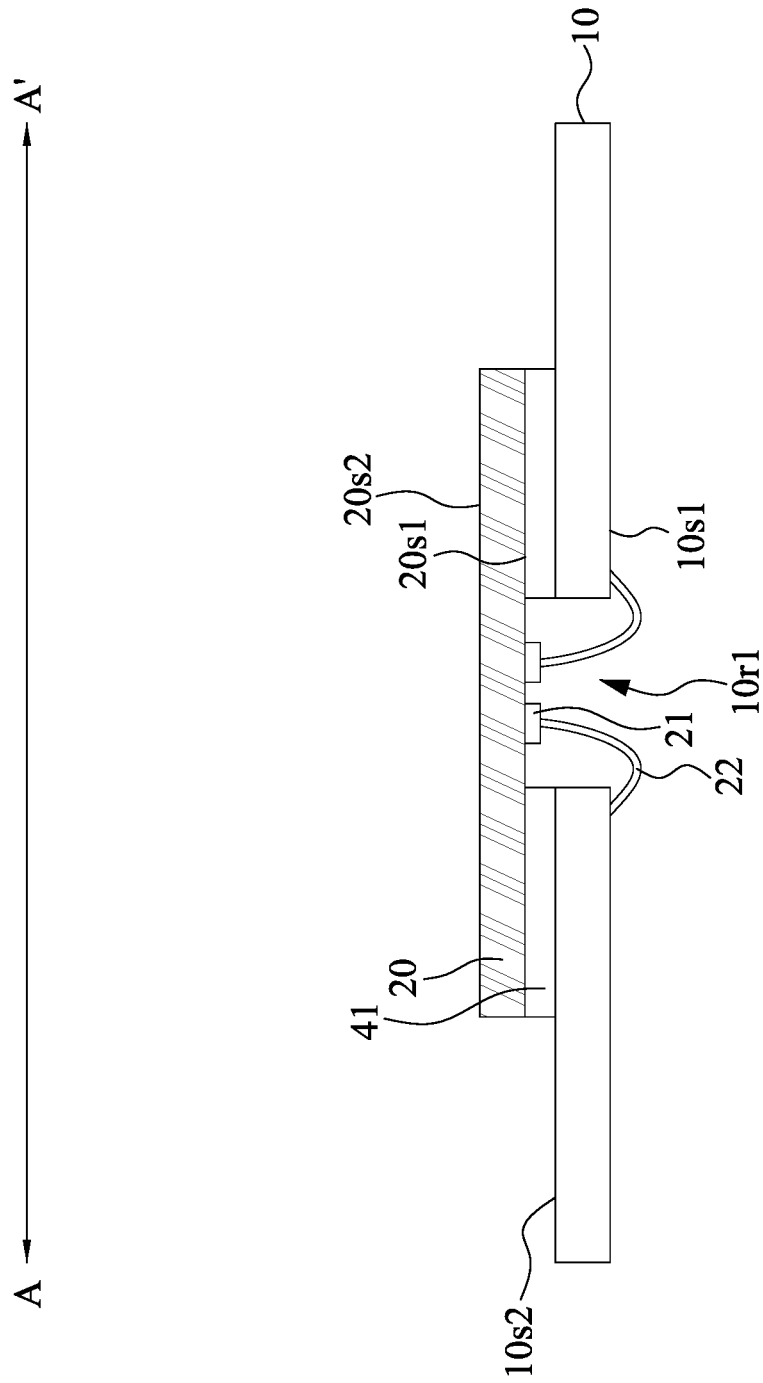
FIG. 9B is a cross-sectional view along line A-A' of the semiconductor device as shown in FIG. 9A, in accordance with some embodiments of the present disclosure.

Referring to FIG. 9A and FIG. 9B, a bonding wire 22 may be formed to electrically connect the substrate 10 and the electronic component 20. In some embodiments, the bonding wire 22 may have a first end bonded to the surface $20s1$ of the electronic component 20 and a second end bonded to the surface $10s1$ of the substrate 10. In some embodiments, the bonding wire 22 may pass through the opening $10r1$ of the substrate 10. In some embodiments, the bonding wire 22 may be bonded to the terminal 21 of the electronic component 20.

Figure 10A:
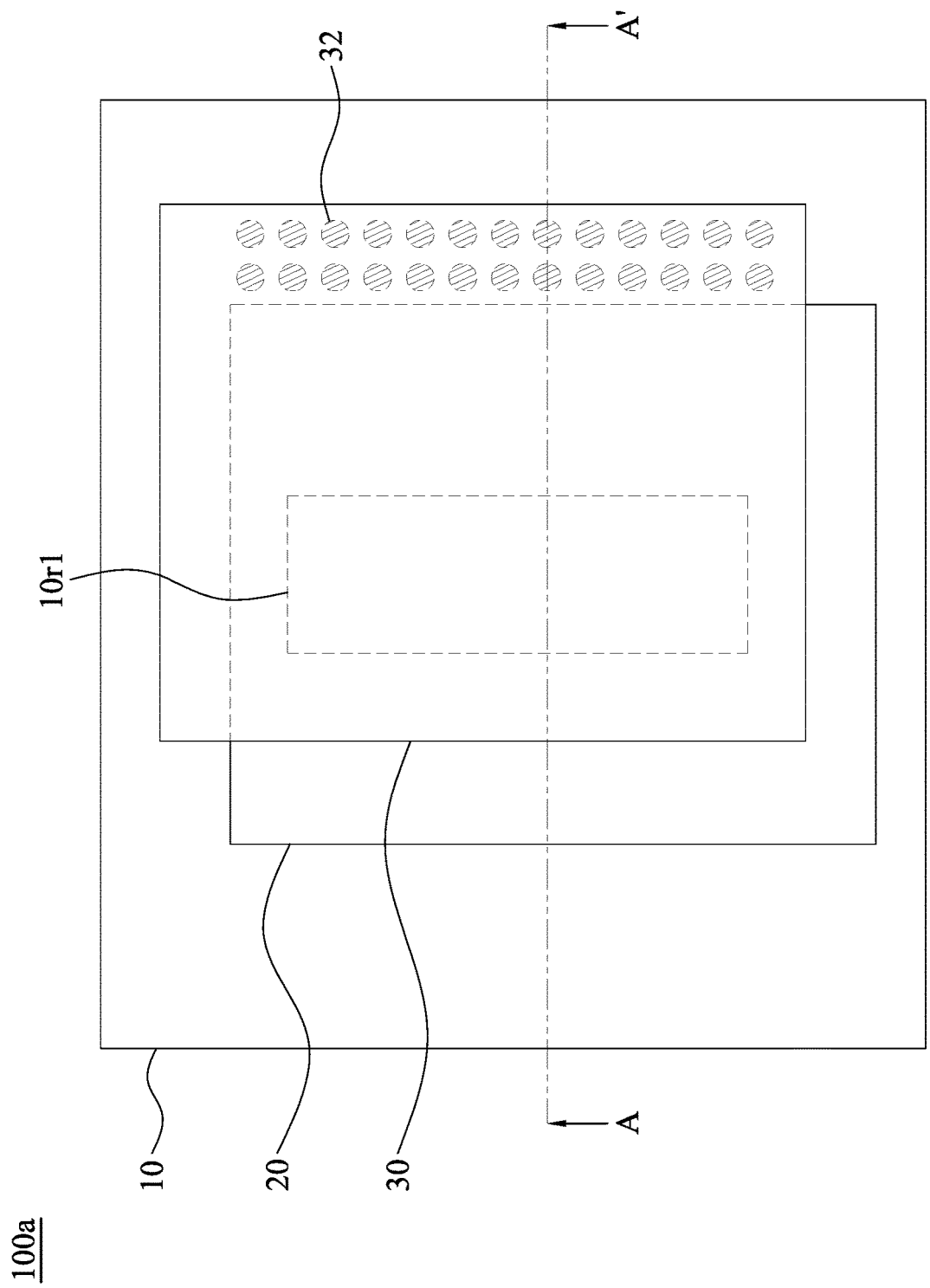
FIG. 10A illustrates one or more stages of an example of a method for manufacturing a semiconductor device according to some embodiments of the present disclosure.
Figure 10B:
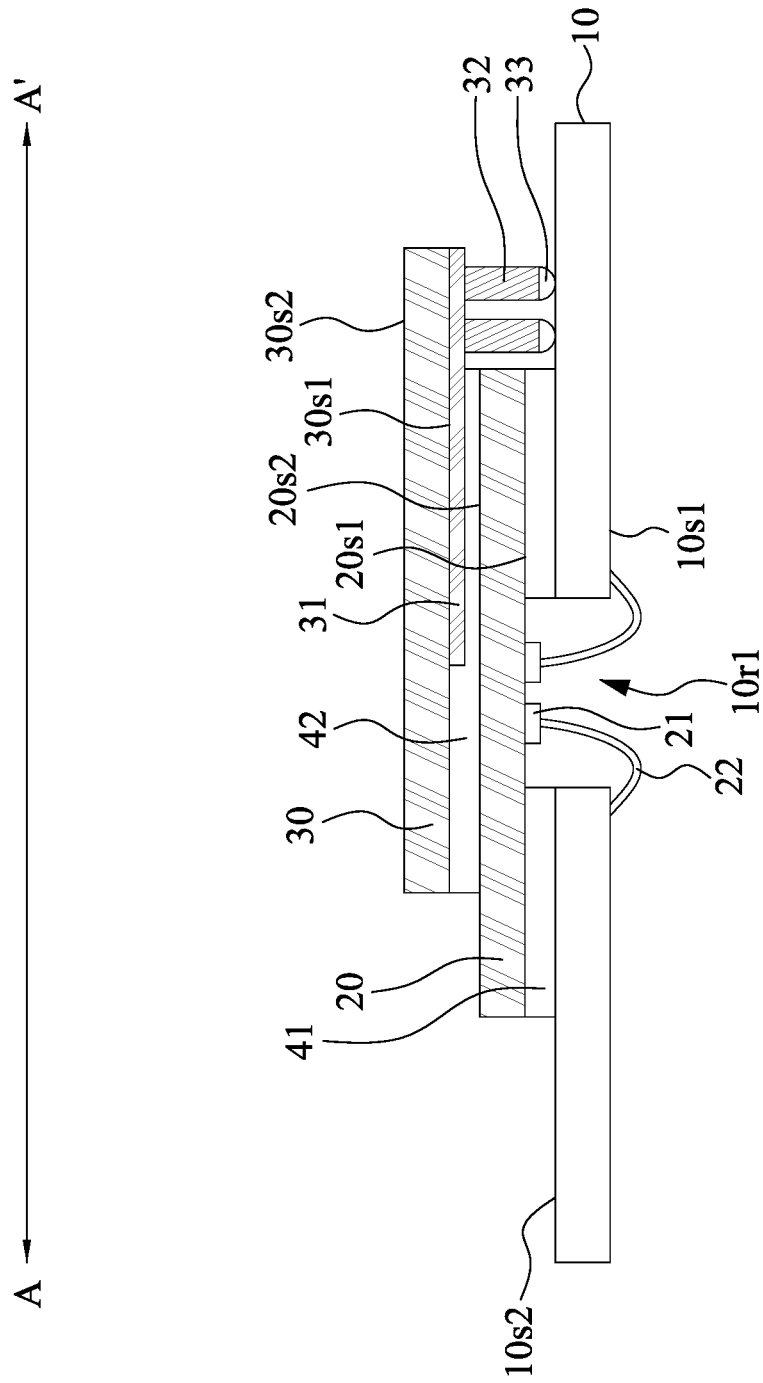
FIG. 10B is a cross-sectional view along line A-A' of the semiconductor device as shown in FIG. 10A, in accordance with some embodiments of the present disclosure.

Referring to FIG. 10A and FIG. 10B, an electronic component may be attached to the surface $20s2$ of the electronic component 20. In some embodiments, the electronic component 30 may be attached to the surface $20s2$ of the electronic component 20 through an adhesive 42. In some embodiments, the electronic component 30 may be located directly above the opening $10r1$ of the substrate 10.

The electronic component 30 may have a surface $30s1$ and a surface $30s2$ opposite to the surface $30s1$. In some embodiments, a plurality of conductive pillars 32 may be formed on the surface $30s1$ of the electronic component 30. The conductive pillars 32 may electrically connect the electronic component 30 to the substrate 10. In some embodiments, the conductive pillars 32 may be formed on the surface $30s1$ of the electronic component 30 before attaching the electronic component 30 to the electronic component 20.

The conductive pillars 32 may be formed by a sputtering operation, an electroplating operation, and a photolithography operation. For example, forming the conductive pillars 32 may include forming a patterned photosensitive layer (not shown) on the surface $30s1$ of the electronic component 30 by a photolithography operation, forming a seed layer on the openings of the patterned photosensitive layer by a sputtering operation, forming a conductive layer on the seed layer by an electroplating operation, and removing the patterned photosensitive layer.

Figure 11A:
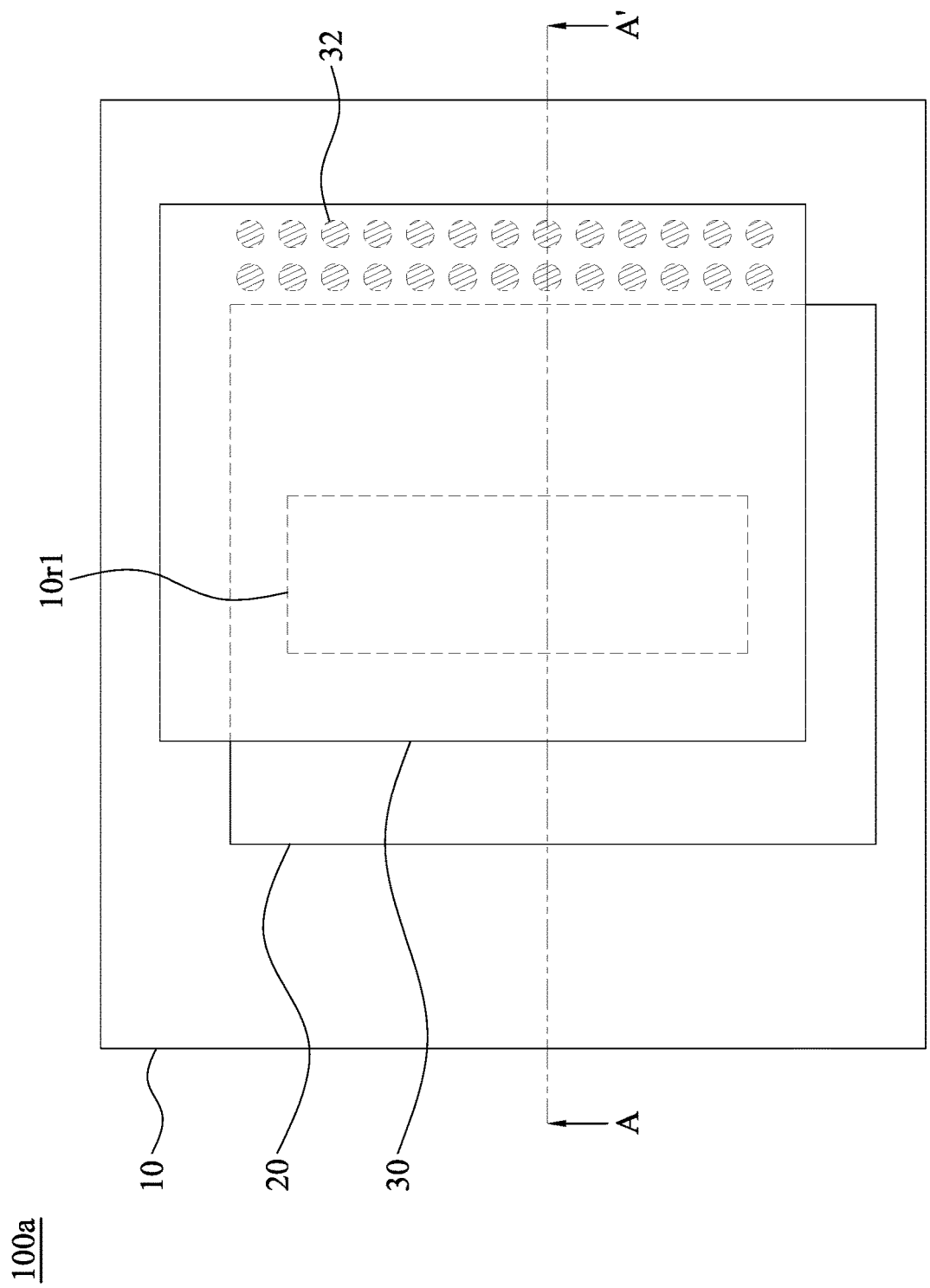
FIG. 11A illustrates one or more stages of an example of a method for manufacturing a semiconductor device according to some embodiments of the present disclosure.
Figure 11B:
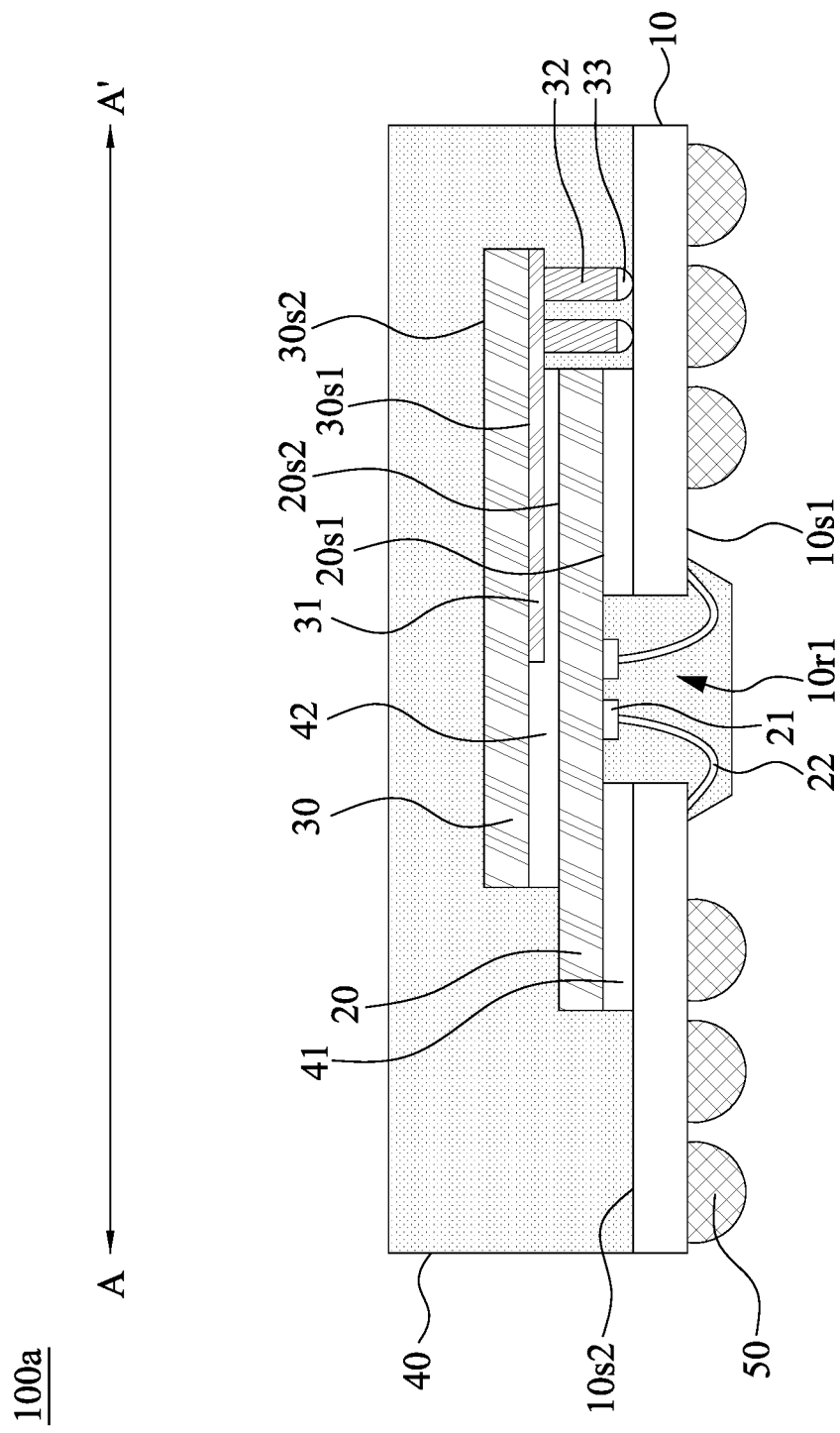
FIG. 11B is a cross-sectional view along line A-A' of the semiconductor device as shown in FIG. 11A, in accordance with some embodiments of the present disclosure.

Referring to FIG. 11A and FIG. 11B, an encapsulant 40 may be formed on the surface $10s2$ of the substrate 10, and electrical connections 50 may be formed on the surface $10s1$ of the substrate 10, which thereby produces the semiconductor device 100a. The encapsulant 40 may be formed by a molding operation. The mold flow can be applied from the surface $10s2$ of the substrate 10, through the opening $10r1$, and enter the surface $10s1$ of the substrate 10. As a result, the encapsulant 40 may encapsulate the electronic components 20, 30, and conductive pillars 32.

In the embodiments of the present disclosure, the bonding wire 22 may be utilized to electrically connect the electronic component 20 to the substrate 10. The electronic component 30 is electrically connected to the substrate 10 through conductive pillars 32. In comparison with the comparative example, only the electronic component 30 needs conductive pillars. As a result, semiconductor manufacturing processes for formation of conductive pillars on the electronic component 20 can be omitted, thereby reducing the cost and improving the device yield.

Figure 12:
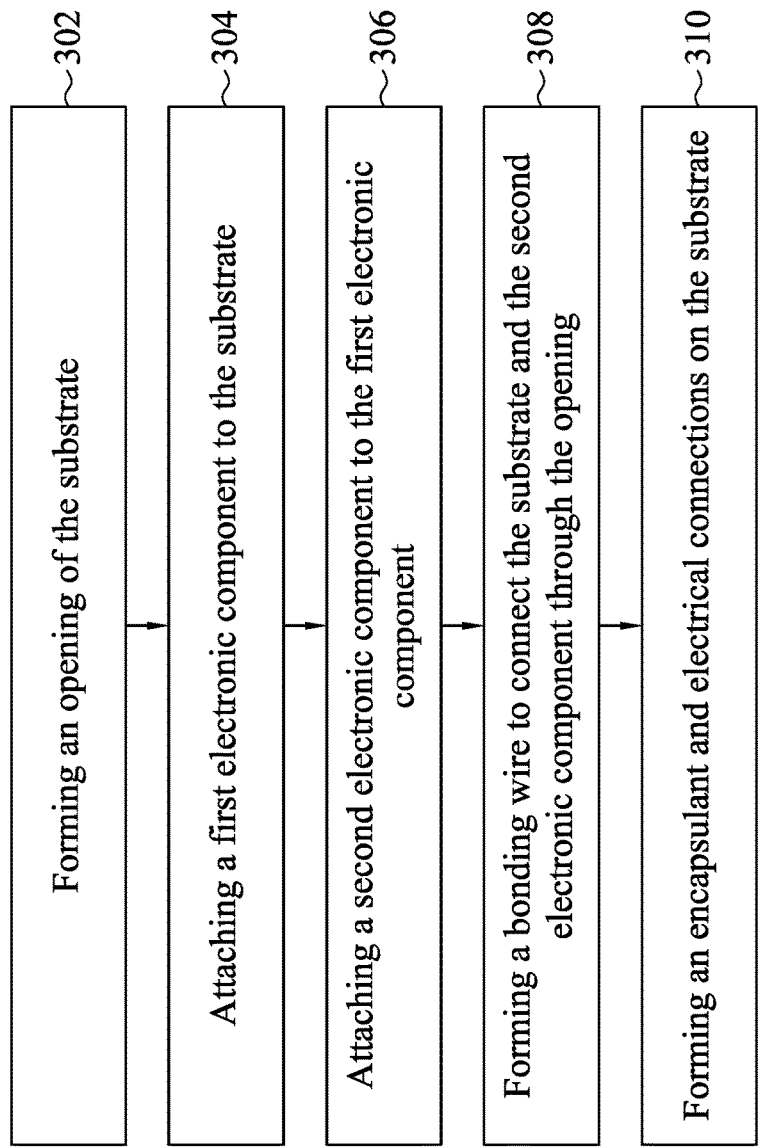
FIG. 12 is a flowchart illustrating a method of manufacturing a semiconductor device, in accordance with some embodiments of the present disclosure.

FIG. 12 is a flowchart illustrating a method 300 of manufacturing a semiconductor device, in accordance with some embodiments of the present disclosure.

The method 300 begins with operation 302, which may be subsequent to the operation 202. An opening defined by the substrate may be formed. The opening may extend between the lower surface and upper surface of the substrate.

The method 300 continues with operation 304 in which a first electronic component may be attached to the upper surface of the substrate. In some embodiments, the first electronic component may be attached to the upper surface of the substrate through an adhesive. In some embodiments, the first electronic component may be free from vertically overlapping the opening of the substrate. In some embodiments, a plurality of conductive pillars may be formed on the active surface of the first electronic component. The conductive pillars may electrically connect the first electronic component to the substrate. In some embodiments, the conductive pillars may be formed on the active surface of the first electronic component before attaching the first electronic component to the substrate.

The method 300 continues with operation 306 in which a second electronic component may be attached to the backside surface of the first electronic component. In some embodiments, the second electronic component may be attached to the backside surface of the first electronic component through an adhesive. In some embodiments, the second electronic component may be located directly above the opening of the substrate. The second electronic component may have a terminal on the active surface of the second electronic component.

The method 300 continues with operation 308 in which a bonding wire may be formed to electrically connect the substrate and the second electronic component. In some embodiments, the bonding wire may have a first end bonded to the active surface of the second electronic component and a second end bonded to the lower surface of the substrate. In some embodiments, the bonding wire may pass through the opening of the substrate. In some embodiments, the bonding wire may be bonded to the terminal of the second electronic component.

The method 300 continues with operation 310 in which an encapsulant may be formed on the upper surface of the substrate, and electrical connections may be formed on the lower surface of the substrate, which thereby produces a semiconductor device.

In the embodiments of the present disclosure, a bonding wire can be utilized to electrically connect the second electronic component to the substrate. The first electronic component is electrically connected to the substrate through conductive pillars. In comparison with the comparative example, only the first electronic component needs conductive pillars. As a result, semiconductor manufacturing processes for formation of conductive pillars on the second electronic component can be omitted, thereby reducing the cost and improving the device yield.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 12. In some embodiments, the method 200 can include one or more operations depicted in FIG. 12.

FIG. 13, FIG. 14, FIG. 15, FIG. 16, and FIG. 17 illustrate one or more stages of an example of a method for manufacturing a semiconductor device according to some embodiments of the present disclosure. In some embodiments, the semiconductor device 100d may be manufactured through the operations described with respect to FIG. 13 to FIG. 17.

Figure 13:
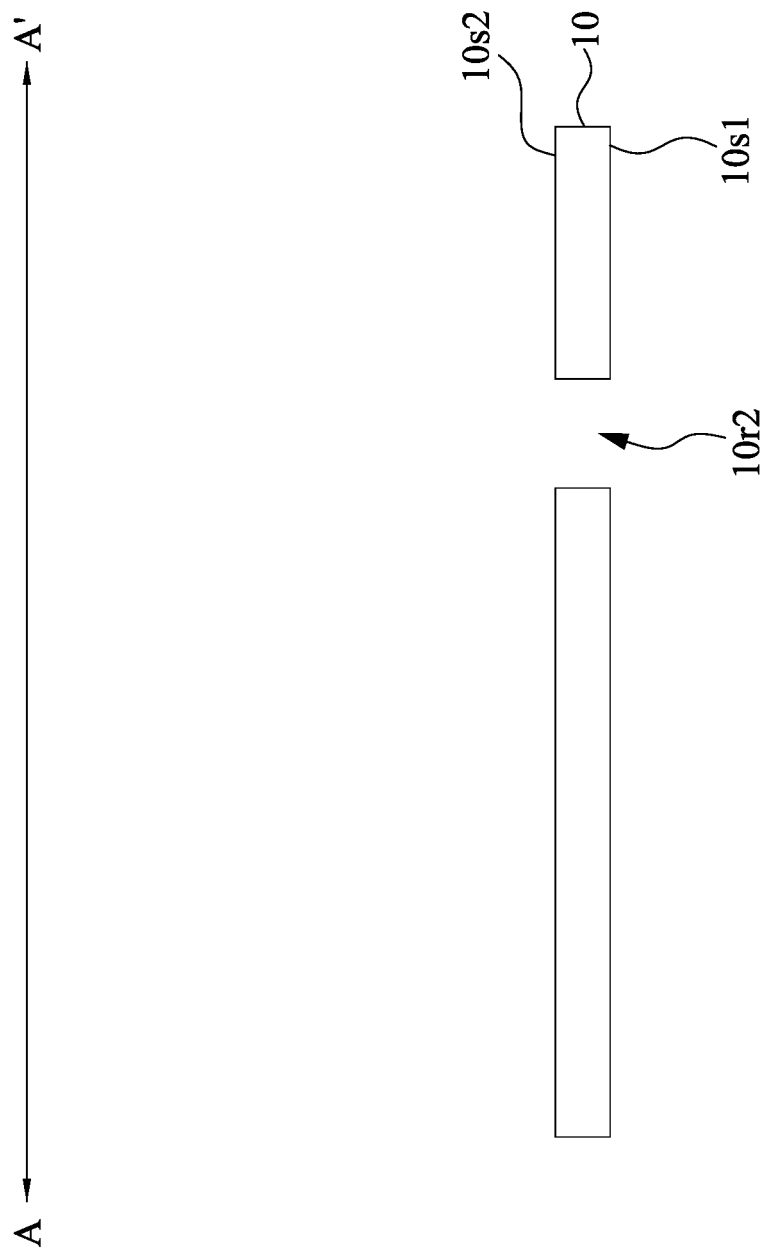
FIG. 13 illustrates one or more stages of an example of a method for manufacturing a semiconductor device according to some embodiments of the present disclosure.

Referring to FIG. 13, the operation thereof may be subsequent to the operation of FIG. 6A and FIG. 6B. An opening 10r2 may be formed. The opening 10r2 may extend between the surfaces 10s1 and 10s2 of the substrate 10.

Figure 14:
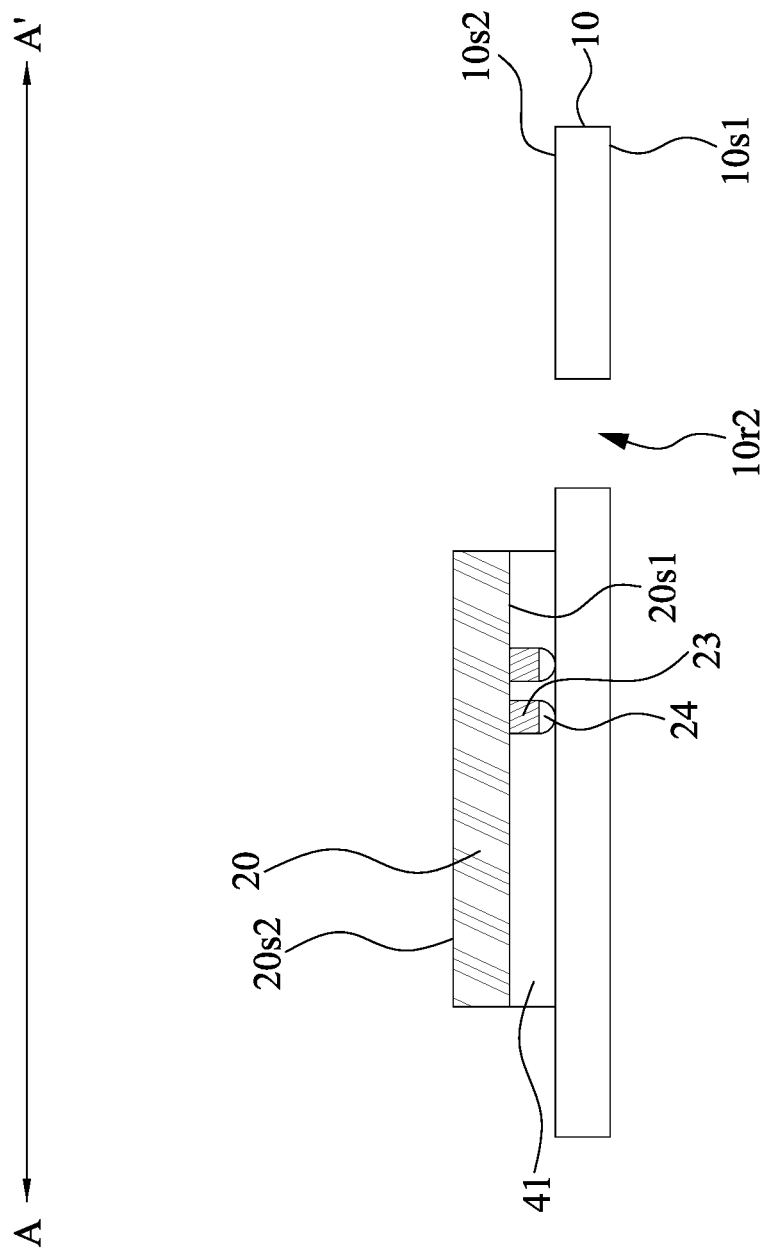
FIG. 14 illustrates one or more stages of an example of a method for manufacturing a semiconductor device according to some embodiments of the present disclosure.

Referring to FIG. 14, an electronic component 20 may be attached to the surface 10s2 of the substrate 10. In some embodiments, the electronic component 20 may be attached to the surface 10s2 of the substrate 10 through an adhesive 41. In some embodiments, the electronic component 20 may be free from vertically overlapping the opening 10r2 of the substrate 10. In some embodiments, a plurality of conductive pillars 23 may be formed on the surface 20s1 of the electronic component 20. The conductive pillars 23 may electrically connect the electronic component 20 to the substrate 10. In some embodiments, the conductive pillars 23 may be formed on the surface 20s1 of the electronic component 20 before attaching the electronic component 20 to the substrate 10. The processes of producing the conductive pillars 23 may be the same as or similar to those of the conductive pillars 32.

Figure 15:
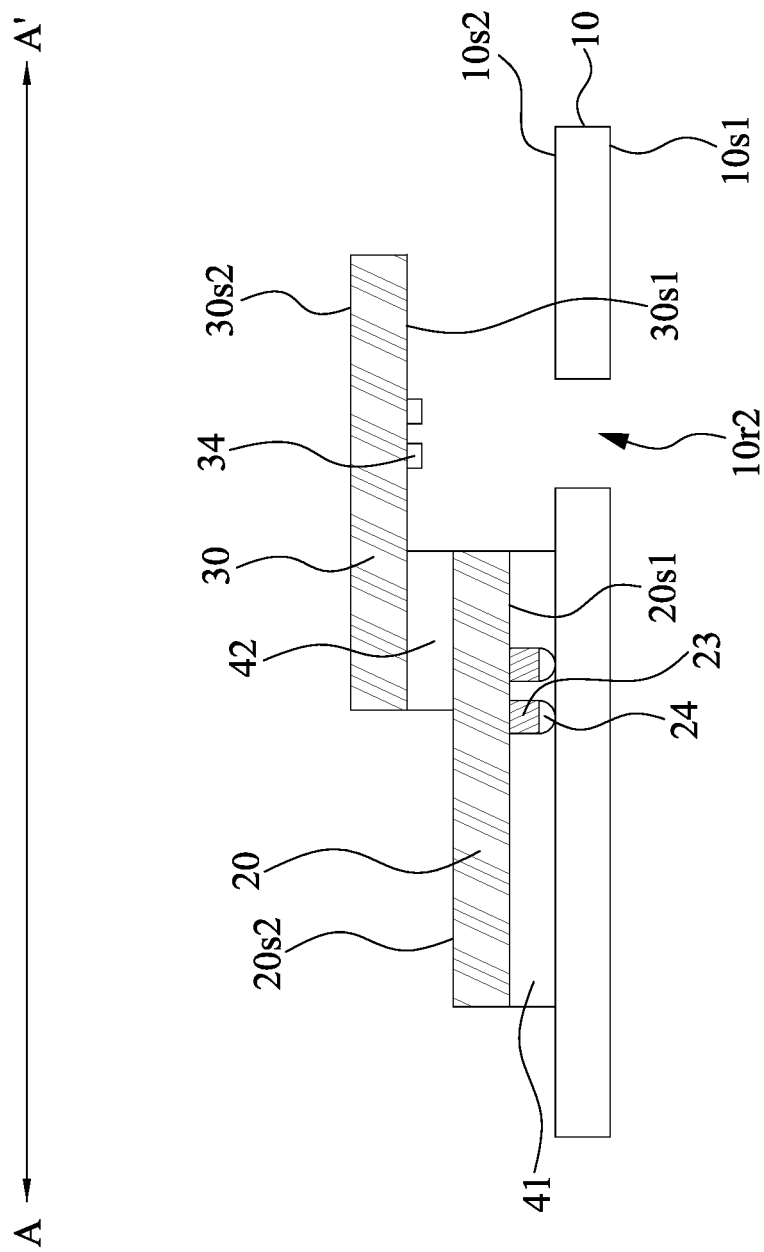
FIG. 15 illustrates one or more stages of an example of a method for manufacturing a semiconductor device according to some embodiments of the present disclosure.

Referring to FIG. 15, an electronic component 30 may be attached to the surface 20s2 of the electronic component 20. In some embodiments, the electronic component 30 may be attached to the surface 20s2 of the electronic component 20 through an adhesive 42. In some embodiments, the electronic component 30 may be located directly above the opening 10r2 of the substrate 10. The electronic component 30 may have a terminal 34 on the surface 30s1 of the electronic component 30.

Figure 16:
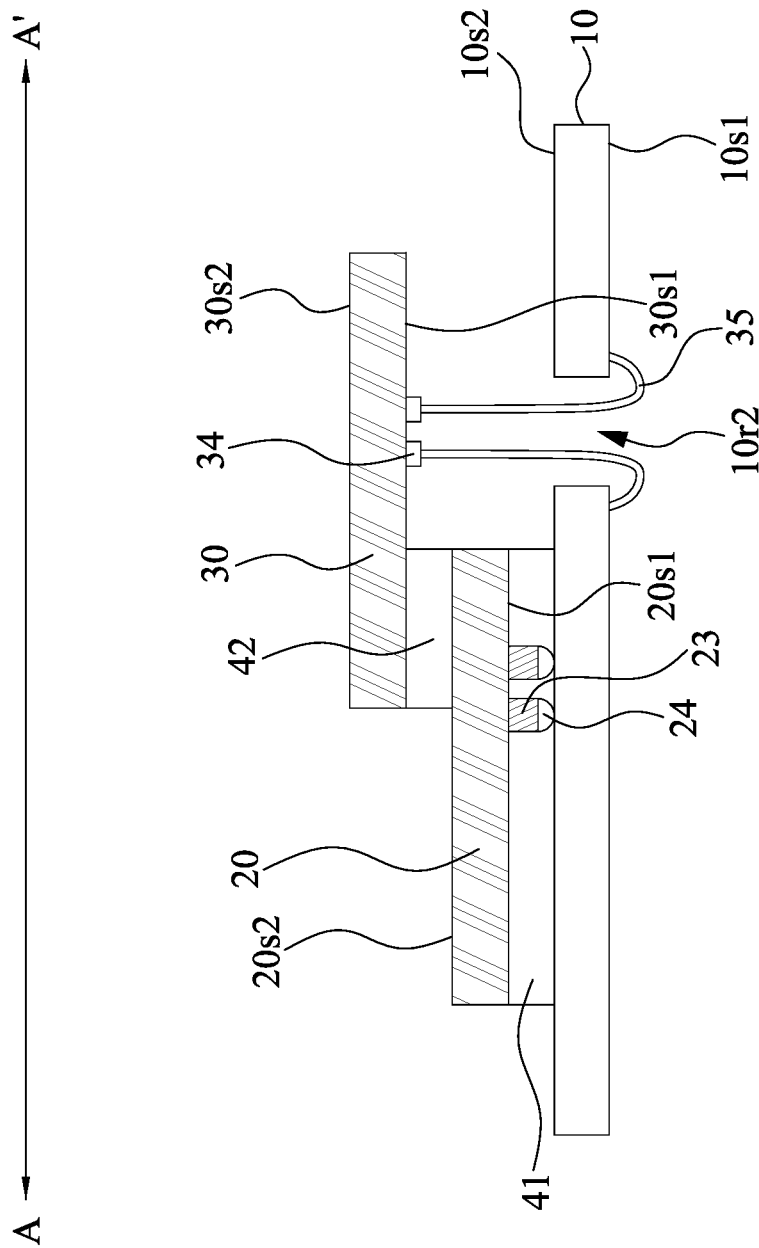
FIG. 16 illustrates one or more stages of an example of a method for manufacturing a semiconductor device according to some embodiments of the present disclosure.

Referring to FIG. 16, a bonding wire 35 may be formed to electrically connect the substrate 10 and the electronic component 30. In some embodiments, the bonding wire 35 may have a first end bonded to the surface 30s1 of the electronic component 30 and a second end bonded to the surface 10s1 of the substrate 10. In some embodiments, the bonding wire 35 may pass through the opening 10r2 of the substrate 10. In some embodiments, the bonding wire 35 may be bonded to terminal 34 of the electronic component 30.

Figure 17:
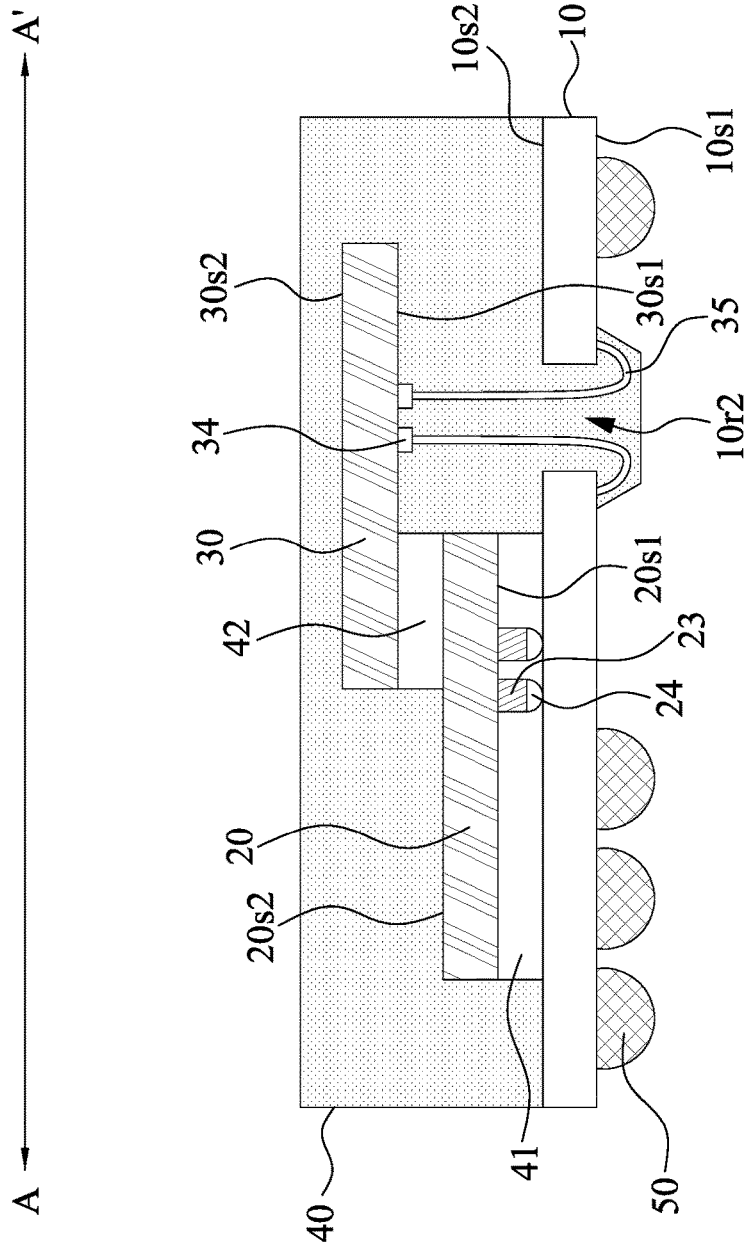
FIG. 17 illustrates one or more stages of an example of a method for manufacturing a semiconductor device according to some embodiments of the present disclosure.

Referring to FIG. 17, an encapsulant 40 may be formed on the surface 10s2 of the substrate 10, and electrical connections 50 may be formed on the surface 10s1 of the substrate 10, which thereby produces the semiconductor device 100d.

In the embodiments of the present disclosure, the substrate has an opening (e.g., 10r2) through which a bonding wire (e.g., e.g., 35) passes. Said bonding wire electrically connects the upper electronic component (e.g., 30) to the substrate. The lower electronic component (e.g., 20) is electrically connected to the substrate through conductive pillars (e.g., 23). In comparison with the comparative example, only the lower electronic component needs conductive pillars. As a result, semiconductor manufacturing processes for formation of longer conductive pillars on the upper electronic component can be omitted, thereby reducing the cost and improving the device yield.

One aspect of the present disclosure provides a semiconductor device. The semiconductor device includes a substrate, a first electronic component, a second electronic component, a bonding wire, and an encapsulant. The substrate has a lower surface and an upper surface opposite to the lower surface. The first electronic component is disposed on the upper surface of the substrate. The bonding wire electrically connects the first electronic component and the substrate and penetrates the substrate. The bonding wire passes through the opening of the substrate. The second electronic component is disposed on the upper surface of the substrate. The second electronic component has an active surface facing the substrate. The encapsulant is disposed on the upper surface of the substrate. The encapsulant protrudes into the substrate and encapsulates the bonding wire.

Another aspect of the present disclosure provides another semiconductor device. The semiconductor device includes a substrate, a first electronic component, a second electronic component, a bonding wire, and a plurality of conductive pillars. The substrate has a lower surface, an upper surface opposite to the lower surface, and an inner lateral surface extending between the upper surface and the lower surface. The first electronic component is disposed on the upper surface of the substrate. The bonding wire electrically connects the first electronic component and the substrate and faces the inner lateral surface of the substrate. The bonding wire passes through the opening of the substrate. The second electronic component is disposed on the upper surface of the substrate. Each of the conductive pillars is disposed on the upper surface of the substrate and electrically connects the second electronic component and the substrate.

Another aspect of the present disclosure provides a method of manufacturing a semiconductor device. The method includes providing a substrate having a lower surface and an upper surface opposite to the lower surface. The method also includes forming an opening extending between the upper surface and the lower surface of the substrate. The method further includes attaching a first electronic component to the upper surface of the substrate. An active surface of the first electronic component faces the upper surface of the substrate. In addition, the method includes attaching a second electronic component to the first electronic component. An active surface of the second electronic component faces the upper surface of the substrate. The method also includes forming a bonding wire on the substrate. The bonding wire passes through the opening of the substrate and electrically connects the substrate and one of the first electronic component or the second electronic component.

In the embodiments of the present disclosure, the substrate has an opening through which a bonding wire passes. Said bonding wire electrically connects a lower (or an upper) electronic component to the substrate. An upper (or the lower) electronic component is electrically connected to the substrate through conductive pillars, which are formed by performing multiple semiconductor manufacturing processes. As a result, semiconductor manufacturing processes for formation of conductive pillars on the lower electronic component can be omitted, thereby reducing the cost and improving the device yield.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate having a lower surface and an upper surface opposite to the lower surface, wherein the substrate further has an opening extended from the lower surface to the upper surface;
a first electronic component disposed on the upper surface of the substrate above the opening thereof, wherein the first electronic component has an upper surface, a lower surface, a first side surface, and a second side surface;
a bonding wire electrically connecting the first electronic component and the substrate, wherein the bonding wire is extended from the lower surface the substrate to the lower surface of the first electronic component through the opening of the substrate;
a second electronic component disposed on the upper surface of the substrate and above the opening, wherein the second electronic component has an active surface facing the substrate, wherein the second electronic component has an upper surface, a lower surface, a first side surface, and a second side surface, wherein the first side surface of the first electronic component is located between the first side surface and the second side surface of the second electronic component, wherein the second side surface of the second electronic component is located between the first side surface and the second side surface of the first electronic component;
an encapsulant disposed on the upper surface of the substrate, wherein the encapsulant extends within the substrate and encapsulates the bonding wire; and
a plurality of conductive pillars extending between the active surface of the second electronic component and the upper surface of the substrate, wherein a portion of the upper surface of the first electronic component which is extended from the first side surface thereof is covered by the second electronic component, wherein an opposed portion of the upper surface of the first electronic component which is extended from the second side surface thereof is exposed from the second electronic component.

2. The semiconductor device of claim 1, wherein the second electronic component is located above the upper surface of the first electronic component, and a portion of the encapsulant is surrounded by the substrate, and the portion of the encapsulant vertically overlaps the second electronic component.

3. The semiconductor device of claim 1, wherein the first electronic component is located above the second electronic component, and a portion of the encapsulant is surrounded by the substrate, and the portion of the encapsulant is free from vertically overlapping the second electronic component.

4. The semiconductor device of claim 1, wherein the plurality of conductive pillars are disposed adjacent to the first side surface of the first electronic component.

5. The semiconductor device of claim 4, wherein the second side surface of the first electronic component is free from facing the plurality of conductive pillars.

6. The semiconductor device of claim 5, wherein a first surface area of the first electronic component is the same as a second surface area of the second electronic component, such that a distance between the first side surface and the second side surface of the first electronic component is equal to a distance between the first side surface and the second side surface of the second electronic component.

7. The semiconductor device of claim 4, wherein the first electronic component has a third side extending between the first side and the second side, and a portion of the plurality of conductive pillars faces the third side of the first electronic component.

8. The semiconductor device of claim 4, wherein a portion of the plurality of conductive pillars faces the second side of the first electronic component, and a first surface area of the first electronic component is less than a second surface area of the second electronic component.

9. The semiconductor device of claim 1, wherein the encapsulant encapsulates the plurality of conductive pillars, and the encapsulant is in contact with the lower surface of the substrate, wherein the second electronic component comprises a circuit layer disposed on the active area of the second electronic component at the lower surface thereof, wherein the plurality of conductive pillars are extended from the circuit layer to the upper surface of the substrate.

10. A semiconductor device, comprising:
a substrate having a lower surface, an upper surface opposite to the lower surface and an inner lateral surface extending between the upper surface and the lower surface of the substrate;
a first electronic component disposed on the upper surface of the substrate, wherein the first electronic component has an upper surface, a lower surface, a first side surface, and a second side surface;
a bonding wire electrically connecting the first electronic component and the substrate, wherein the bonding wire faces the inner lateral surface of the substrate;
a second electronic component disposed on the upper surface of the substrate, wherein the second electronic component has an upper surface, a lower surface, a first side surface, and a second side surface, wherein the first side surface of the first electronic component is located between the first side surface and the second side surface of the second electronic component, wherein the second side surface of the second electronic component is located between the first side surface and the second side surface of the first electronic component; and
a plurality of conductive pillars disposed on the upper surface of the substrate, each of which electrically connects the second electronic component and the substrate.

11. The semiconductor device of claim 10, wherein the second electronic component is located above the upper surface of the first electronic component.

12. The semiconductor device of claim 10, wherein the first electronic component is located above the second electronic component.

13. The semiconductor device of claim 10, wherein the plurality of conductive pillars are disposed adjacent to the first side surface of the first electronic component.

14. The semiconductor device of claim 13, wherein the second side surface of the first electronic component is free from facing the plurality of conductive pillars, and a first surface area of the first electronic component is the same as a second surface area of the second electronic component, such that a distance between the first side surface and the second side surface of the first electronic component is equal to a distance between the first side surface and the second side surface of the second electronic component.

15. The semiconductor device of claim 13, wherein the first electronic component has a third side extending between the first side and the second side, and a portion of the plurality of conductive pillars face the third side of the first electronic component.

16. The semiconductor device of claim 13, wherein a portion of the plurality of conductive pillars face the second side of the first electronic component, and a first surface area of the first electronic component is less than a second surface area of the second electronic component.

17. The semiconductor device of claim 10, further comprising:
an encapsulant disposed on the upper surface of the substrate, wherein the encapsulant encapsulates the plurality of conductive pillars, wherein the plurality of conductive pillars are only connected to one side portion of the second electronic component adjacent to the first side surface of the first electronic component.

18. The semiconductor device of claim 17, wherein the encapsulant is in contact with the lower surface of the substrate, wherein the second electronic component comprises a circuit layer disposed on the lower surface of the second electronic component, wherein the plurality of conductive pillars are extended from the circuit layer to the upper surface of the substrate.

19. The semiconductor device of claim 17, wherein the encapsulant has a portion surrounded by the inner lateral surface of the substrate, and the portion of the encapsulant is free from vertically overlapping the second electronic component.

* * * * *